United States Patent
Ho et al.

(10) Patent No.: US 12,514,009 B2
(45) Date of Patent: Dec. 30, 2025

(54) ISOLATION STRUCTURE CONFIGURED TO REDUCE CROSS TALK IN IMAGE SENSOR

(71) Applicant: Taiwan Semiconductor Manufacturing Company, Ltd., Hsinchu (TW)

(72) Inventors: Cheng-Ying Ho, Minxiong Township (TW); Wen-De Wang, Minsyong Township (TW); Keng-Yu Chou, Kaohsiung (TW); Kai-Chun Hsu, Yonghe (TW); Tzu-Hsuan Hsu, Kaohsiung (TW); Jen-Cheng Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 706 days.

(21) Appl. No.: 17/861,708

(22) Filed: Jul. 11, 2022

(65) Prior Publication Data

US 2023/0326951 A1    Oct. 12, 2023

Related U.S. Application Data

(60) Provisional application No. 63/329,955, filed on Apr. 12, 2022.

(51) Int. Cl.
*H10F 39/12*    (2025.01)
*H01L 21/762*   (2006.01)
*H10F 39/00*    (2025.01)

(52) U.S. Cl.
CPC ..... *H10F 39/199* (2025.01); *H01L 21/76224* (2013.01); *H10F 39/024* (2025.01); *H10F 39/811* (2025.01)

(58) Field of Classification Search
CPC ..... H10F 39/199; H10F 39/014; H10F 39/807
See application file for complete search history.

(56) References Cited

U.S. PATENT DOCUMENTS

| | | |
|---|---|---|
| 2014/0035901 A1 | 2/2014 | Chen et al. |
| 2014/0166958 A1 | 6/2014 | Barabash et al. |
| 2016/0276394 A1* | 9/2016 | Chou ............... H10F 39/811 |
| 2017/0077157 A1 | 3/2017 | Cheng et al. |
| 2017/0170216 A1 | 6/2017 | Lee et al. |

(Continued)

FOREIGN PATENT DOCUMENTS

| | | |
|---|---|---|
| CN | 104637968 A | 5/2015 |
| CN | 108470740 A | 8/2018 |

(Continued)

*Primary Examiner* — Sonya McCall-Shepard
(74) *Attorney, Agent, or Firm* — Eschweiler & Potashnik, LLC

(57) ABSTRACT

Various embodiments of the present disclosure are directed towards an image sensor having a photodetector disposed within a semiconductor substrate. A dielectric structure is disposed on a first side of the semiconductor substrate. An isolation structure extends from the dielectric structure into the first side of the semiconductor substrate. The isolation structure laterally wraps around the photodetector and comprises an upper portion disposed above the first side of the semiconductor substrate and directly contacting sidewalls of the dielectric structure. The isolation structure comprises a first material different from a second material of the dielectric structure.

20 Claims, 26 Drawing Sheets

(56) References Cited

U.S. PATENT DOCUMENTS

| | | | |
|---|---|---|---|
| 2017/0360788 A1 | 12/2017 | Whitehead et al. | |
| 2018/0015175 A1 | 1/2018 | Kim et al. | |
| 2018/0151759 A1* | 5/2018 | Huang | H10F 77/40 |
| 2018/0301490 A1 | 10/2018 | Dofuku | |
| 2019/0067356 A1* | 2/2019 | Lin | H10F 39/182 |
| 2019/0139997 A1* | 5/2019 | Chiang | H10F 39/807 |
| 2019/0148434 A1* | 5/2019 | Hsu | H10F 39/8057 |
| | | | 257/432 |
| 2020/0006410 A1 | 1/2020 | Wu et al. | |
| 2020/0083268 A1* | 3/2020 | Kim | H10F 39/024 |
| 2020/0135798 A1 | 4/2020 | Tsao et al. | |
| 2020/0403023 A1* | 12/2020 | Huang | H04N 25/76 |
| 2021/0017526 A1 | 1/2021 | Xu et al. | |
| 2021/0225919 A1 | 7/2021 | Li et al. | |
| 2021/0366954 A1 | 11/2021 | Chen et al. | |
| 2022/0052096 A1 | 2/2022 | Lin et al. | |
| 2023/0089511 A1* | 3/2023 | Chen | H10F 39/199 |
| | | | 257/432 |
| 2023/0282671 A1* | 9/2023 | Zang | H10F 39/8057 |
| | | | 257/432 |

FOREIGN PATENT DOCUMENTS

| | | |
|---|---|---|
| CN | 110660817 A | 1/2020 |
| CN | 112397539 A | 2/2021 |
| KR | 20210053152 A | 5/2021 |

\* cited by examiner

ISOLATION STRUCTURE CONFIGURED TO REDUCE CROSS TALK IN IMAGE SENSOR

REFERENCE TO RELATED APPLICATION

This application claims the benefit of U.S. Provisional Application No. 63/329,955, filed on Apr. 12, 2022, the contents of which are incorporated by reference in their entirety.

BACKGROUND

Many modern-day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CIS). Compared to CCD pixel sensors, CIS are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
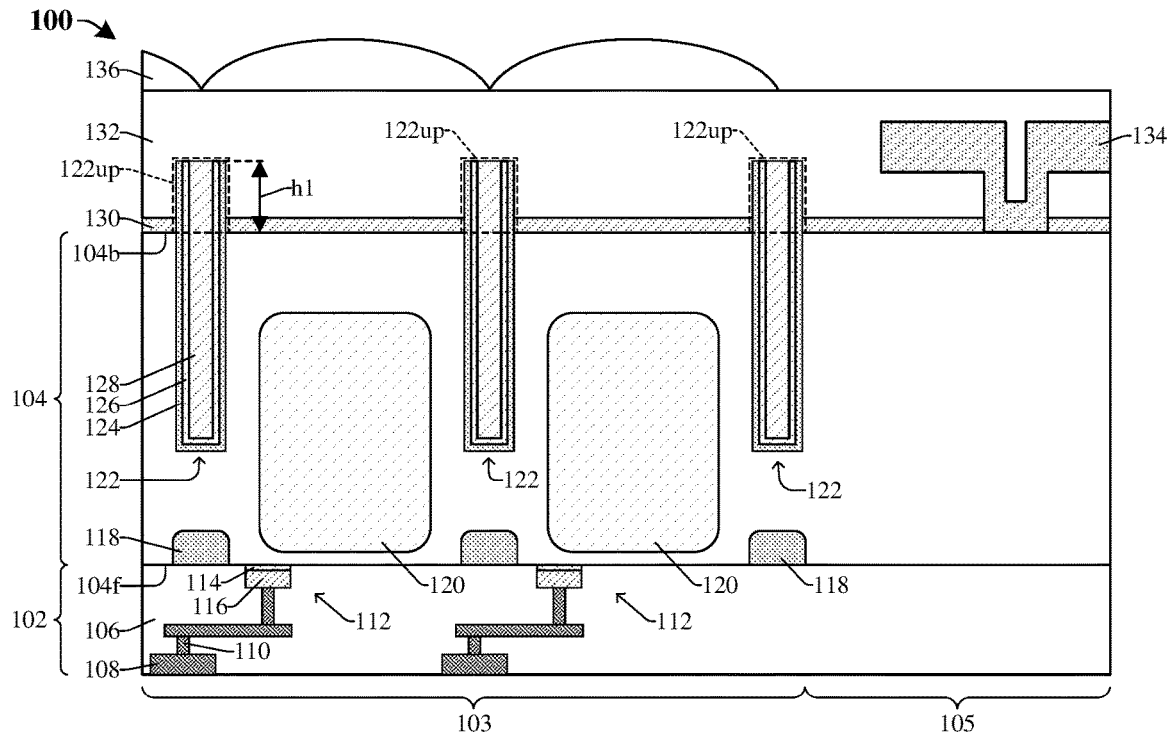
FIG. 1 illustrates a cross-sectional view of some embodiments of an image sensor comprising an isolation structure protruding above a semiconductor substrate into an upper dielectric structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

Some complementary metal-oxide semiconductor image sensors (CISs) include a plurality of photodetectors disposed in a semiconductor substrate. A plurality of pixel devices (e.g., transfer transistors, reset transistors, etc.) and an interconnect structure are disposed on a front-side surface of the semiconductor substrate. The photodetectors are configured to record incident light disposed on a back-side surface of the semiconductor substrate, and the pixel devices facilitate readout of the recording. An isolation structure (e.g., a deep trench isolation (DTI) structure) extends into the back-side surface of the semiconductor substrate and is disposed laterally between adjacent photodetectors in the plurality of photodetectors. The isolation structure is configured to increase optical and electrical isolation between adjacent photodetectors. A passivation layer overlies the back-side surface of the semiconductor substrate and an upper dielectric structure overlies the isolation structure. Further, a metal grid structure overlies the upper dielectric structure is arranged around a plurality of grid openings that directly over the plurality of photodetectors. The metal grid structure is configured to direct incident light towards the photodetectors and decrease cross talk among the photodetectors, thereby further increasing optical isolation between the photodetectors.

One challenge with the above CIS is cross talk between adjacent photodetectors due to a relatively low height of the isolation structure. For example, a top surface of the isolation structure is aligned with the back-side surface of the semiconductor substrate and/or is disposed below the upper dielectric structure. This results in the isolation structure being separated from the metal grid structure by a relatively large distance (e.g., within a range of about 1000 angstroms to about 1600 angstroms). Incident light disposed at an angle relative to the back-side surface of the semiconductor substrate may traverse the relatively large distance between the isolation structure and metal grid structure from a first photodetector to an adjacent second photodetector. This increases cross talk among the photodetectors and decreases a quantum efficiency (QE) of the first photodetector. Thus, the relatively low height of the isolation structure decreases optical isolation between the photodetectors, thereby decreasing an overall performance of the CIS.

In some embodiments, the present application is directed towards an image sensor comprising an isolation structure protruding above a semiconductor substrate and configured to increase optical isolation of the image sensor. The image sensor comprises a plurality of photodetectors disposed in the semiconductor substrate. The isolation structure extends into a back-side surface of the semiconductor substrate and is disposed laterally between adjacent photodetectors. An upper dielectric structure overlies the back-side surface of the semiconductor substrate. The isolation structure comprises an upper portion that protrudes out of the back-side surface of the semiconductor substrate into the upper dielectric structure such that a height of the isolation structure over the back-side surface of the semiconductor substrate is relatively large (e.g., within a range of about 800 angstroms to about 1300 angstroms). Due to the relatively large height of the isolation structure over the semiconductor substrate, a vertical path for incident light (e.g., oblique incident light) to traverse between a first photodetector and an adjacent second photodetector is decreased. This, in part, decreases cross talk between adjacent photodetectors and increases an overall performance of the image sensor.

In addition, the image sensor may comprise a grid structure over the isolation structure. The upper portion of the isolation structure protrudes out of the back-side surface of the isolation structure to contact a bottom surface of the isolation structure. This mitigates incident light disposed at an angle relative to the back-side surface of the semiconductor substrate from traversing a distance between the isolation structure and grid structure, thereby further decreasing cross talk among the photodetectors.

FIG. 1 illustrates a cross-sectional view 100 of some embodiments of an image sensor comprising an isolation structure protruding above a semiconductor substrate into an upper dielectric structure.

The image sensor comprises a plurality of photodetectors 120 disposed within a semiconductor substrate 104 and an interconnect structure 102 disposed along a front-side surface 104f of the semiconductor substrate 104. In some embodiments, the semiconductor substrate 104 comprises any semiconductor body (e.g., bulk silicon) and/or has a first doping type (e.g., p-type). The interconnect structure 102 comprises an interconnect dielectric structure 106, a plurality of conductive wires 108, and a plurality of conductive vias 110. A plurality of pixel devices 112 is disposed on the front-side surface 104f of the semiconductor substrate 104.

The pixel devices 112 are electrically coupled to one another and/or other semiconductor devices (not shown) by way of the plurality of conductive wires and vias 108, 110. The plurality of pixel devices 112 may comprise a gate electrode 116 and a gate dielectric layer 114 disposed between the gate electrode 116 and the front-side surface 104f of the semiconductor substrate 104.

The photodetectors 120 are disposed laterally within a pixel region 103 of the semiconductor substrate 104. The photodetectors 120 each comprise a second doping type (e.g., n-type) opposite the first doping type (e.g., p-type). In some embodiments, the first doping type is p-type and the second doping type is n-type or vice versa. The photodetectors 120 are configured to absorb incident light (e.g., photons) and generate respective electrical signals corresponding to the incident light. In such embodiments, the photodetectors 120 may generate electron-hole pairs from the incident light. The pixel devices 112 are configured to conduct readout of the generated electrical signals from the plurality of photodetectors 120. For example, the pixel devices 112 may be or comprise one or more transfer transistors configured to selectively form a conductive channel in the semiconductor substrate 104 to transfer accumulated charge (e.g., via absorbing incident radiation) from the photodetectors 120.

A shallow trench isolation (STI) structure 118 is disposed in the semiconductor substrate 104 along the front-side surface 104f of the semiconductor substrate 104. An isolation structure 122 extends into a back-side surface 104b of the semiconductor substrate 104. A passivation layer 130 overlies the back-side surface 104b and an upper dielectric structure 132 overlies the passivation layer 130. A plurality of micro-lenses 136 overlies the back-side surface 104b of the semiconductor substrate 104 and is configured to focus the incident light towards the photodetectors 120. Further, a conductive pad 134 overlies the back-side surface 104b of the semiconductor substrate 104 and is disposed laterally in a peripheral region 105 of the semiconductor substrate 104 that is adjacent to the pixel region 103. In various embodiments, the peripheral region 105 continuously laterally wraps around the pixel region 103. In yet further embodiments, the conductive pad 134 continuously laterally warps around the plurality of photodetectors 120 along an unbroken path. In some embodiments, the conductive pad 134 is configured as and/or referred to as a conductive shielding structure that is configured to block incident light from traversing the back-side surface 104b of the semiconductor substrate 104 to the peripheral region 105 of the semiconductor substrate 104. In further embodiments, the conductive pad 134 directly contacts the semiconductor substrate 104 such that the conductive pad 134 and the semiconductor substrate 104 are directly electrically coupled together.

The isolation structure 122 is disposed within the semiconductor substrate 104 and comprises a first liner layer 124, a second liner layer 126, and a trench fill layer 128. In various embodiments, the first liner layer 124 comprises a first dielectric material (e.g., a high-k dielectric) and the second liner layer 126 comprises a second dielectric material (e.g., an oxide such as silicon dioxide) different from the first dielectric material. Further, the trench fill layer 128 may comprise polysilicon, doped polysilicon, a metal (e.g., tungsten, aluminum, etc.). The isolation structure 122 is configured to direct incident light towards a corresponding photodetector 120. For example, incident light disposed at an angle over a first photodetector may strike a sidewall of the isolation structure 122 and be redirected towards the first photodetector instead of traversing the isolation structure 122 to an adjacent second photodetector. Thus, the isolation structure 122 increases a QE of each photodetector 120 and increases optical isolation.

Further, the isolation structure 122 comprises an upper portion 122*up* that protrudes through the back-side surface 104*b* and the passivation layer 130 into the upper dielectric structure 132. The upper portion 122*up* of the isolation structure 122 has a height h1 that is relatively large (e.g., within a range of about 800 angstroms to about 1300 angstroms) above the back-side surface 104*b*. Due to the relatively large height h1 of the upper portion 122*up* there is a shorter vertical path for incident light disposed at an angle relative to the back-side surface 104*b* to traverse a region between adjacent photodetectors 120. This decreases cross talk in the plurality of photodetectors and increases overall optical isolation of the image sensor.

In various embodiments, the height h1 of the upper portion 122*up* of the isolation structure 122 is within a range of about 800 angstroms to about 1300 angstroms, within a range of about 800 angstroms to about 1050 angstroms, within a range of about 1050 angstroms to about 1300 angstroms, or some other suitable value. In some embodiments, by virtue of the height h1 being relatively large (e.g., equal to or greater than about 800 angstroms), the upper portion 122*up* of the isolation structure 122 is sufficiently tall to mitigate cross talk between adjacent photodetectors 120 while maintaining structural integrity. In further embodiments, by virtue of the height h1 being less than about 1300 angstroms, the upper portion 122*up* of the isolation structure 122 increases optical isolation of the image sensor while decreasing costs associated with fabricating the image sensor and facilitating device scaling.

Figure 2:
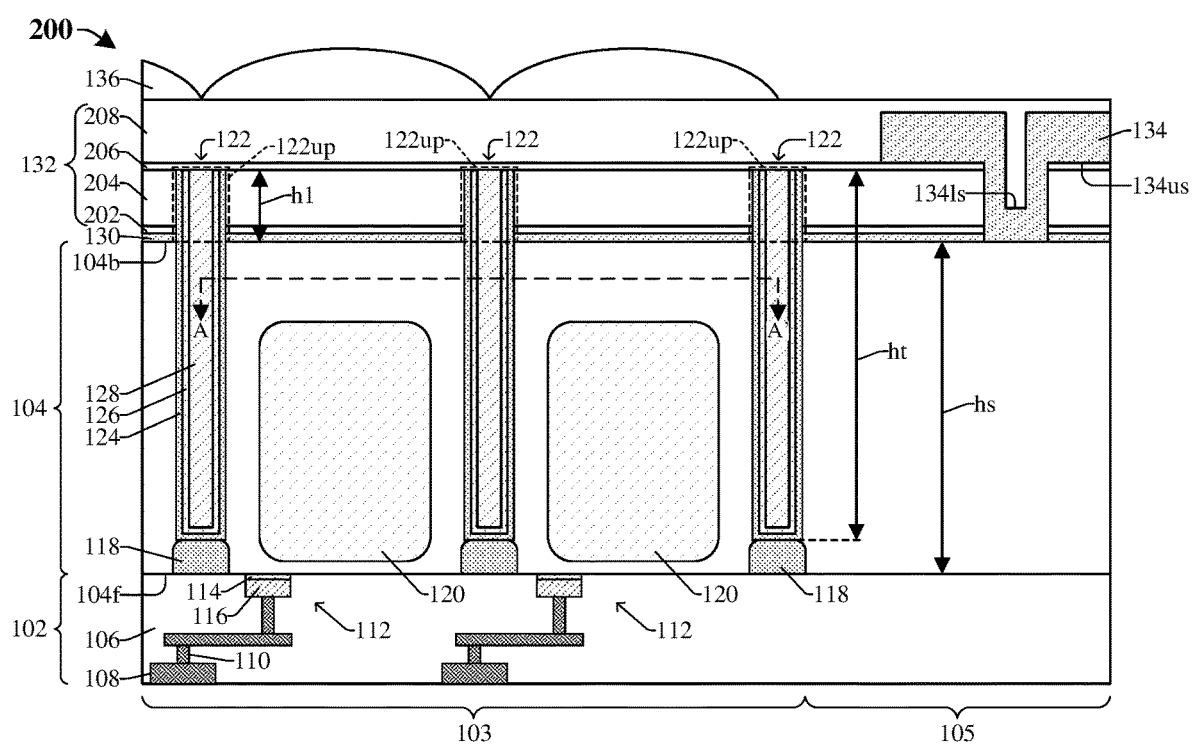
FIG. 2 illustrates a cross-sectional view of some other embodiments of the image sensor of FIG. 1.

FIG. 2 illustrates a cross-sectional view 200 of some embodiments of an image sensor comprising an isolation structure protruding above a semiconductor substrate into an upper dielectric structure.

The image sensor of FIG. 2 includes a plurality of photodetectors 120 disposed in a semiconductor substrate 104 that has a front-side surface 104*f* opposite a back-side surface 104*b*. An isolation structure 122 extends into the back-side surface 104*b* and comprises an upper portion 122*up* that protrudes out of the semiconductor substrate 104 into the upper dielectric structure 132. The isolation structure 122 laterally encloses the plurality of photodetectors and is spaced between adjacent photodetectors in the plurality of photodetectors 120. The semiconductor substrate 104 may, for example, be or comprise monocrystalline silicon, epitaxial silicon, germanium, silicon-germanium, a silicon-on-insulator (SOI) substrate, another semiconductor material, any combination of the foregoing, or the like. In some embodiments, the semiconductor substrate 104 has a first doping type (e.g., p-type). The interconnect structure 102 is disposed on the front-side surface 104*f* of the semiconductor substrate 104 and comprises an interconnect dielectric structure 106, a plurality of conductive wires 108, and a plurality of conductive vias 110. The interconnect dielectric structure 106 may comprise one or more dielectric layers that may each, for example, be or comprise silicon dioxide, a low-k dielectric material, an extreme low-k dielectric material, another suitable dielectric material, or any combination of the foregoing. As used herein, a low-k dielectric material is a dielectric material with a dielectric constant less than 3.9. The conductive wires and vias 108, 110 may, for example, each be or comprise aluminum, copper, ruthenium, tungsten, titanium nitride, tantalum nitride, another conductive material, or any combination of the foregoing.

A plurality of pixel devices 112 is disposed within and/or on the front-side surface 104*f* of the semiconductor substrate 104. In some embodiments, the pixel devices 112 are configured as transfer transistors and respectively comprise a gate electrode 116 and a gate dielectric layer 114 disposed between the gate electrode 116 and the semiconductor substrate 104. The gate electrode 116 may, for example, be or comprise polysilicon, a metal material such as aluminum, titanium, tantalum, tungsten, another metal material, or any combination of the foregoing. The gate dielectric layer 114 may, for example, be or comprise silicon dioxide, a high-k dielectric material such as tantalum oxide, hafnium oxide, aluminum oxide, another dielectric material, or any combination of the foregoing. As used herein, a high-k dielectric material is a dielectric material with a dielectric constant greater than 3.9.

Further, a shallow trench isolation (STI) structure 118 is disposed in the front-side surface 104*f* of the semiconductor substrate 104. In various embodiments, the STI structure 118 laterally encloses the pixel devices 112 and may, for example, demarcate a device region for a pixel region 103 of the semiconductor substrate 104. The STI structure 118 may, for example, be or comprise silicon nitride, silicon carbide, silicon oxycarbide, silicon oxynitride, silicon dioxide, another suitable dielectric material, or any combination of the foregoing. In some embodiments, a top surface of the STI structure 118 directly contacts a bottom surface of the isolation structure 122. In yet further embodiments, the STI structure 118 may be part of the isolation structure 122 (e.g., the STI structure 118 has a same layout as the isolation structure 122 when viewed from above and directly contacts the isolation structure 122) such that the isolation structure 122 continuously vertically extends from the bottom surface of the third dielectric layer 206 to the back-side surface 104*b* of the semiconductor substrate 104. In such embodiments, the STI structure 118 may be referred to as and/or is configured as a lower portion of the isolation structure 122.

The photodetectors 120 are disposed in the semiconductor substrate 104 and comprise a second doping type (e.g., n-type) opposite the first doping type. In some embodiments, a doping concentration of the photodetectors 120 is within a range of about $10^{13}$ to $10^{16}$ atoms/cm$^3$, or another suitable value. A passivation layer 130 is disposed on the back-side surface 104*b* of the semiconductor substrate 104. The passivation layer 130 may, for example, be or comprise a high-k dielectric material such as titanium oxide, tantalum oxide, aluminum oxide, some other suitable dielectric material, or any combination of the foregoing. Further, an upper dielectric structure 132 overlies the passivation layer 130. In some embodiments, the upper dielectric structure 132 comprises a first dielectric layer 202, a second dielectric layer 204, a third dielectric layer 206, and a fourth dielectric layer 208. In various embodiments, the dielectric layers 202-208 of the upper dielectric structure 132 may, for example, each be or comprise an oxide such as silicon dioxide, another suitable dielectric material, or any combination of the foregoing. In some embodiments, the passivation layer 130, the first dielectric layer 202, and the second dielectric layer 204 respectively directly contact opposing sidewalls of the upper portion 122*up* of the isolation structure 122. In further embodiments, the third dielectric layer 206 directly contacts a top surface of the isolation structure 122. In yet further embodiments, a top surface of the second dielectric layer 204 is co-planar with the top surface of the isolation structure 122.

A plurality of micro-lenses 136 overlies the upper dielectric structure 132. The micro-lenses 136 are configured to focus incident light towards the photodetectors 120. A conductive pad 134 is disposed over the back-side surface 104b of the semiconductor substrate 104 and is spaced laterally in a peripheral region 105 of the semiconductor substrate 104 that is adjacent to the pixel region 103. In various embodiments, the conductive pad 134 is disposed in the upper dielectric structure 132 and extends through the passivation layer 130 to contact the back-side surface 104b of the semiconductor substrate. In further embodiments, the conductive pad 134 comprises an upper surface 134us disposed along a top surface of the third dielectric layer 206 and a lower surface 134ls vertically below the upper surface 134us. In yet further embodiments, the conductive pad 134 is configured as a conductive shielding structure that blocks incident light from traversing the back-side surface 104b of the semiconductor substrate 104 to the peripheral region 105 of the semiconductor substrate 104. The conductive pad 134 may, for example, be or comprise a metal material such as aluminum, copper, titanium, tungsten, another conductive material, or any combination of the foregoing. In some embodiments, the top surface of the isolation structure 122 is vertically between the lower surface 134ls of the conductive pad 134 and the upper surface 134us of the conductive pad 134.

The isolation structure 122 continuously extends from the upper dielectric structure 132 into the semiconductor substrate 104. In some embodiments, the bottom surface of the isolation structure 122 is disposed between the front-side surface 104f and the back-side surface 104b. In various embodiments, the isolation structure 122 comprises a first liner layer 124, a second liner layer 126, and a trench fill layer 128. The trench fill layer 128 extends into the semiconductor substrate 104 and the first liner layer 124 is disposed between the trench fill layer 128 and the semiconductor substrate 104. The second liner layer 126 is disposed between the first liner layer 124 and the trench fill layer 128. In various embodiments, a top surface of the first liner layer 124, a top surface of the second liner layer 126, and a top surface of the trench fill layer 128 are co-planar with one another. The second liner layer 126 extends along opposing sidewalls of the trench fill layer 128 and cups a bottom surface of the trench fill layer 128. Further, the first liner layer 124 extends along opposing sidewalls of the second liner layer 126 and cups a bottom surface of the second liner layer 126. In various embodiments, a thickness of the trench fill layer 128 is greater than a thickness of the first liner layer 124 and a thickness of the second liner layer 126. In further embodiments, a height ht of the isolation structure 122 is greater than a height hs of the semiconductor substrate 104

The first liner layer 124 may, for example, be or comprise a high-k dielectric material such as aluminum oxide, hafnium oxide, titanium oxide, another high-k dielectric material, another dielectric material, or any combination of the foregoing. The second liner layer 126 may, for example, be or comprise silicon dioxide, another suitable dielectric material, or the like. In some embodiments, a dielectric constant of the first liner layer 124 is greater than a dielectric constant of the second liner layer 126. The trench fill layer 128 may, for example, be or comprise polysilicon, doped polysilicon, a metal such as tungsten, aluminum, another metal material, or any combination of the foregoing. Further, a height h1 of the upper portion 122up of the isolation structure 122 above the back-side surface 104b of the semiconductor substrate 104 is within a range of about 800 angstroms to about 1300 angstroms or some other suitable value. Due to the relatively large height h1 of the upper portion 122up there is a shorter path for incident light disposed at an angle relative to the back-side surface 104b to traverse a region between adjacent photodetectors 120. This decreases cross talk in the plurality of photodetectors 120 and increases overall optical isolation of the image sensor. Further, by virtue of the trench fill layer 128 comprising a metal (e.g., tungsten, aluminum, etc.), incident light is likely to reflect off sidewalls of the trench fill layer 128 towards a corresponding photodetector 120 and is unlikely to traverse the isolation structure 122 between adjacent photodetectors 120. Thus, the material and relatively large height h1 of the upper portion 122up increases a performance of the image sensor.

Figure 3:
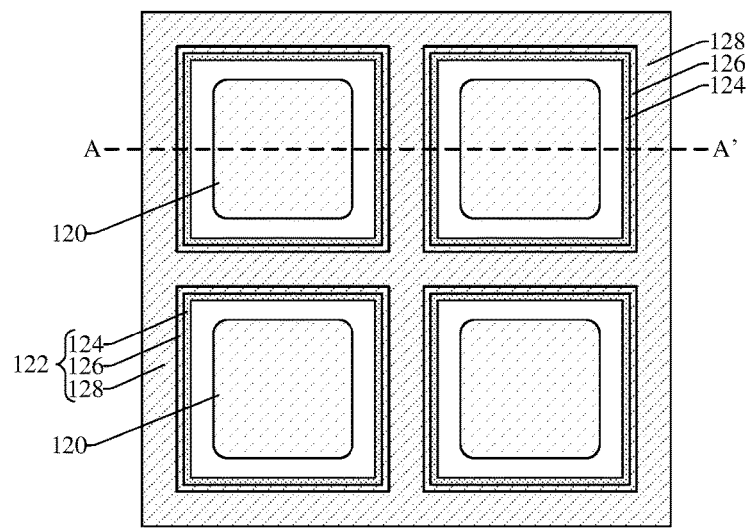
FIG. 3 illustrates a top view of some embodiments of the image sensor of FIG. 2 taken along the line A-A'.

FIG. 3 illustrates a top view 300 of some embodiments of the image sensor of FIG. 2 taken along the line A-A' of FIG. 2. As illustrated in the top view 300 of FIG. 3, the isolation structure 122 laterally encloses the plurality of photodetectors 120. The isolation structure 122 has a grid structure and continuously extends between adjacent photodetectors in the plurality of photodetectors 120.

Figure 4A:
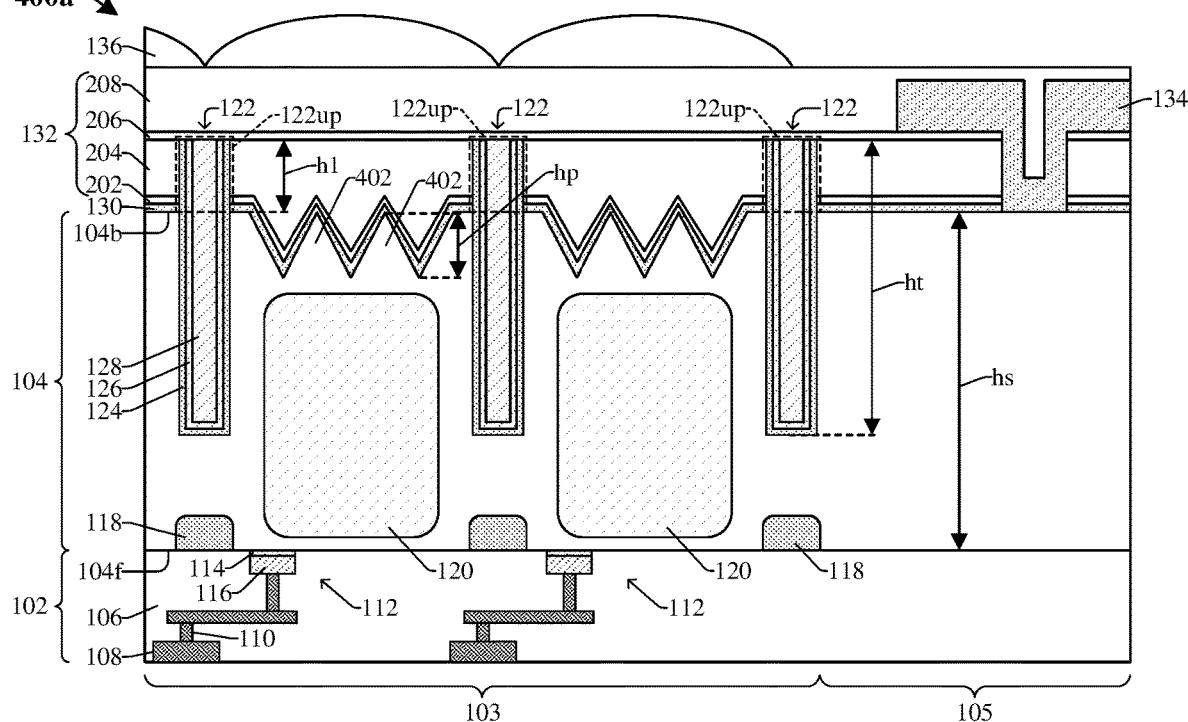
FIGS. 4A and 4B illustrate various cross-sectional views of some other embodiments of the image sensor of FIG. 1, where the semiconductor substrate comprises a plurality of protrusions.

FIG. 4A illustrates a cross-sectional view 400a of some alternative embodiments of the image sensor of FIG. 1, in which the semiconductor substrate 104 comprises a plurality of protrusions 402 disposed on the back-side surface 104b of the semiconductor substrate 104. In various embodiments, the plurality of protrusions 402 provide a non-flat pattern (e.g., a jig-saw pattern) in the semiconductor substrate 104 above the photodetectors 120 and are configured to increase a light receiving surface area for incident light disposed on the back-side surface 104b of the semiconductor substrate 104. Accordingly, the protrusions 402 increase a sensitivity and/or a QE of the photodetectors 120, thereby increasing an overall performance of the image sensor. The passivation layer 130 and first dielectric layer 202 conform to a shape of the protrusions 402, where the passivation layer directly contacts the protrusions 402. In various embodiments, the second dielectric layer 204 comprises a plurality of upper protrusions that extend below a top surface of the semiconductor substrate 104 and are adjacent to the protrusions 402. In some embodiments, the upper protrusions of the second dielectric layer 204 have a same shape (e.g., a triangular shape) as the protrusions 402 of the semiconductor substrate 104. In yet further embodiments, the height h1 of the upper portion 122up of the isolation structure 122 is greater than a height hp of the protrusions 402. This, in part, facilitates the isolation structure 122 being sufficiently tall to mitigate cross talk between adjacent photodetectors 120. In yet further embodiments, the height ht of the isolation structure 122 is less than the height hs of the semiconductor substrate 104.

Figure 4B:
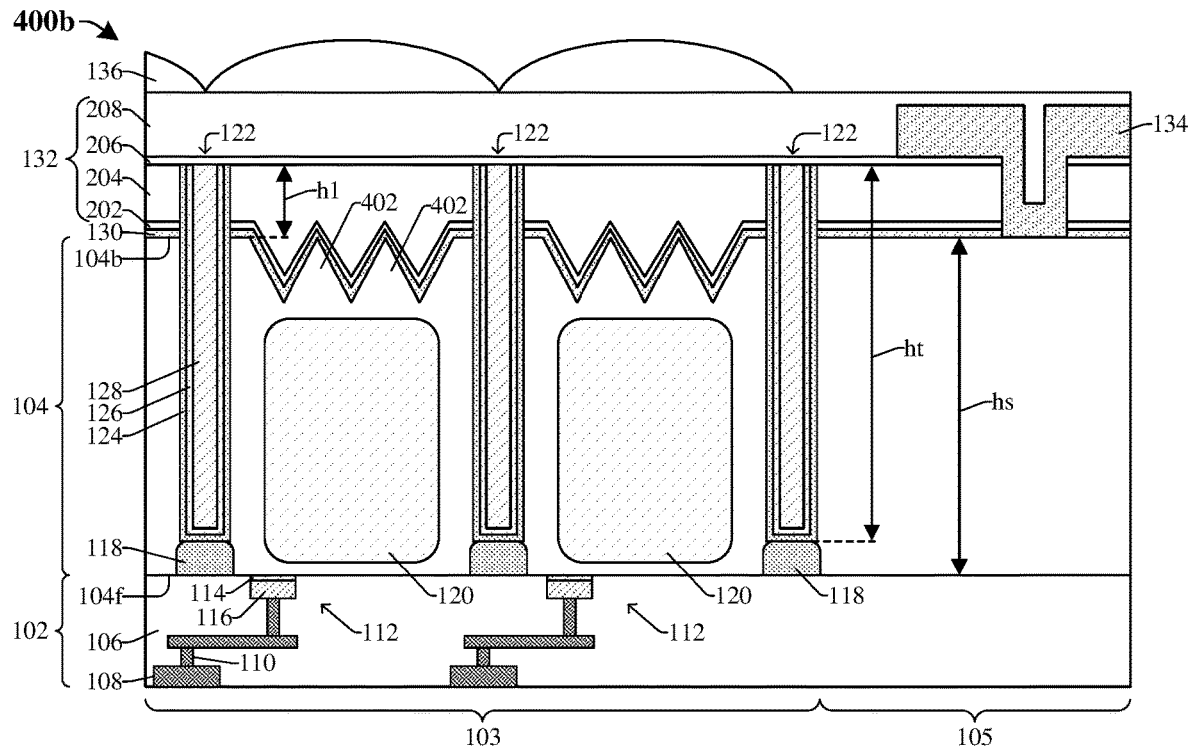

FIG. 4B illustrates a cross-sectional view 400b of some alternative embodiments of the image sensor of FIG. 4A, in which the isolation structure 122 continuously extends from the third dielectric layer 206 to the STI structure 118. In various embodiments, a bottom surface of the isolation structure 122 directly contacts a top surface of the STI structure 118.

Figure 5A:
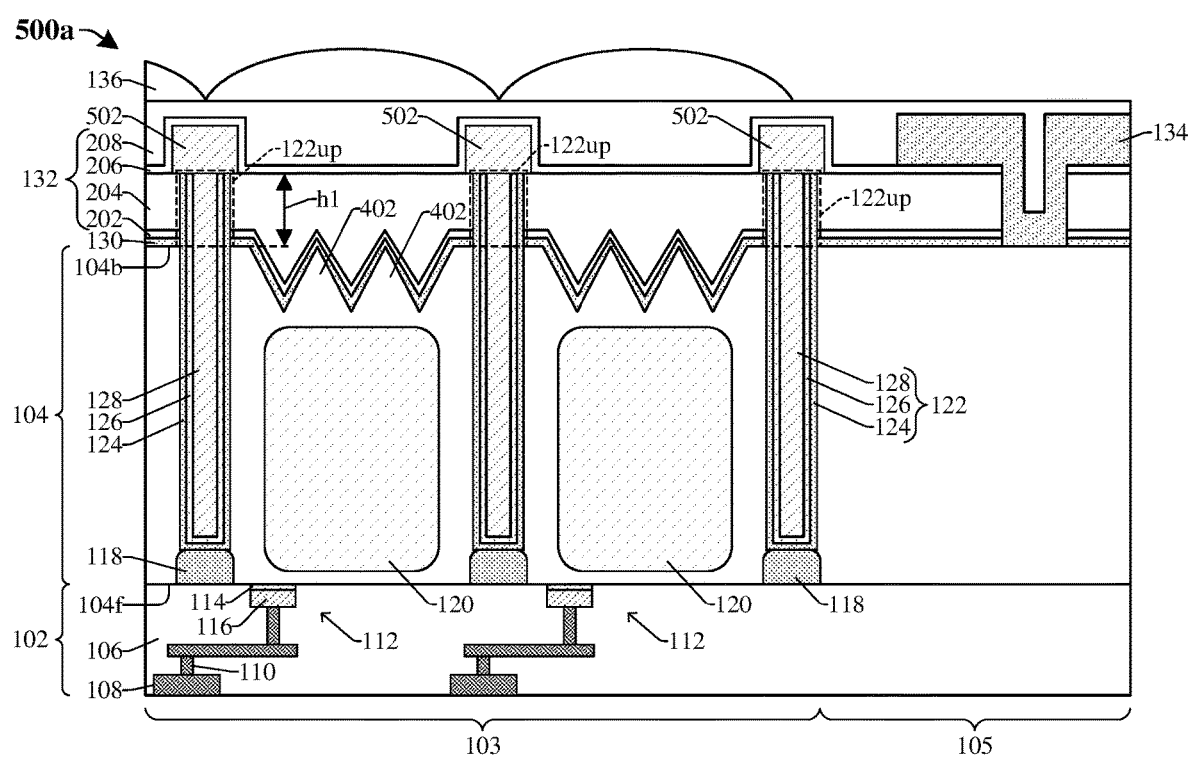
FIGS. 5A-5D illustrate various cross-sectional views of some other embodiments of the image sensor of FIG. 1, where a metal grid structure is disposed over the isolation structure.

FIG. 5A illustrates a cross-sectional view 500a of some alternative embodiments of the image sensor of FIG. 4A, in which a metal grid structure 502 is disposed in the upper dielectric structure 132 and overlies the isolation structure 122.

The metal grid structure 502 comprises sidewalls that define a plurality of openings directly overlying a corresponding photodetector in the plurality of photodetectors 120. In some embodiments, the metal grid structure 502 comprises one or more metal layers that is/are configured to reduce cross talk between adjacent photodetectors in the plurality of photodetectors 120, thereby increasing optical isolation of the image sensor. For instance, due to a metal material and layout of the metal grid structure 502, incident light (e.g., oblique incident light) disposed on the back-side surface 104b of the semiconductor substrate 104 may reflect off the metal grid structure 502 (e.g., reflect off a sidewall of the metal grid structure 502) towards a corresponding photodetector 120. The metal grid structure 502 may, for example, be or comprise tungsten, aluminum, another metal material, or any combination of the foregoing. In yet further embodiments, the metal grid structure 502 and the trench fill layer 128 comprise a same material (e.g., tungsten, aluminum, etc.). In further embodiments, the metal grid structure 502 comprises a different material than the conductive pad 134. In some embodiments, a height of the metal grid structure 502 is less than the height h1 of the upper portion 122up of the isolation structure 122.

A bottom surface of the metal grid structure 502 directly contacts the top surface of the trench fill layer 128. In various embodiments, no dielectric material (e.g., from the upper dielectric structure 132) is disposed between the metal grid structure 502 and the trench fill layer 128. By virtue of the metal grid structure 502 directly contacting the trench fill layer 128, incident light disposed at an angle relative to the back-side surface 104b of the semiconductor substrate 104 is mitigated from passing through a space between the metal grid structure 502 and the trench fill layer 128. Instead the incident light may reflect off a sidewall of the upper portion 122up of the isolation structure 122 and/or off a sidewall of the metal grid structure 502 towards a corresponding photodetector 120. This, in part, further increases the optical isolation between the photodetectors 120 and further increases an overall performance of the image sensor. In yet further embodiments, the metal grid structure 502 directly overlies the isolation structure 122 and has a grid shaped layout that corresponds to the grid layout of the isolation structure 122 (e.g., as illustrated in FIG. 3). In yet further embodiments, a center of the metal grid structure 502 is aligned with a center of the isolation structure 122.

Figure 5B:
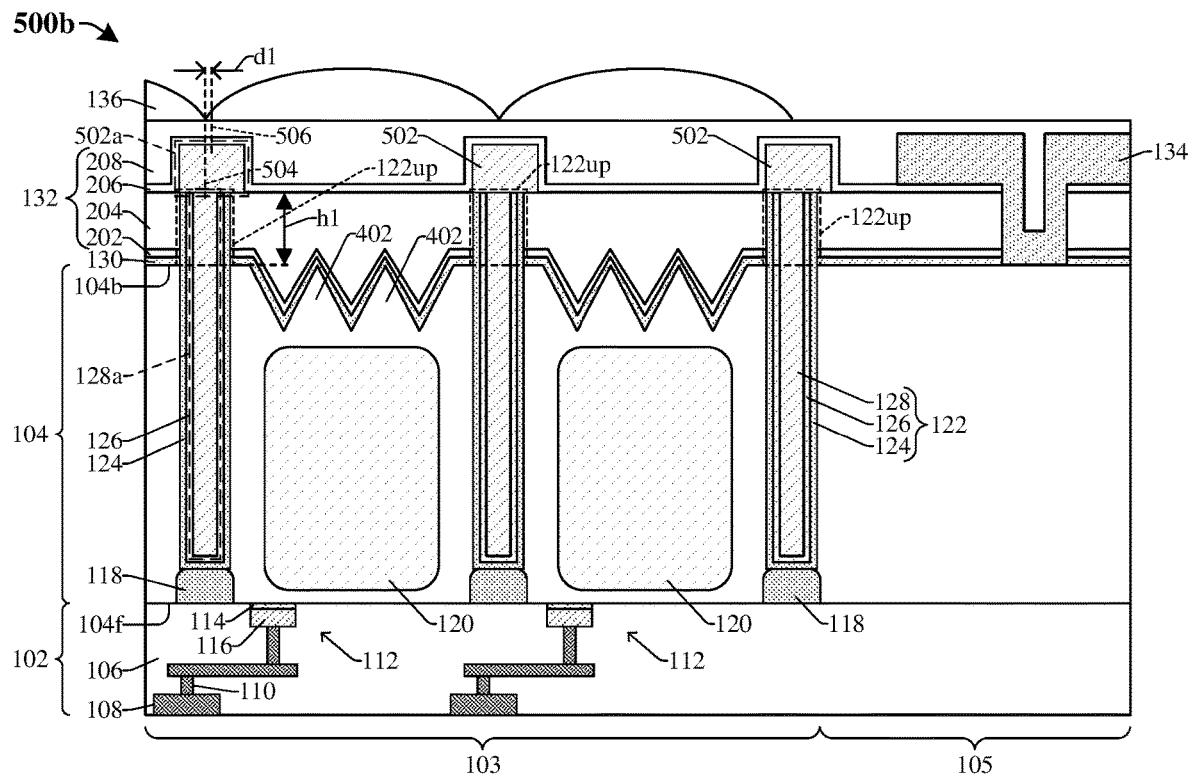

FIG. 5B illustrates a cross-sectional view 500b of some alternative embodiments of the image sensor of FIG. 5A, in which the metal grid structure 502 is laterally shifted towards the peripheral region 105. The metal grid structure 502 comprises a first grid segment 502a that directly overlies a first isolation structure segment 128a of the trench fill layer 128. In some embodiments, a center 504 of the first isolation structure segment 128a is laterally offset from a center 506 of the first grid segment 502a by a non-zero distance dl. In various embodiments, the center of the metal grid structure 502 is laterally shifted from the center of the isolation structure 122 towards the peripheral region 105 by the distance dl. Laterally shifting the metal grid structure 502 towards the peripheral region 105 blocks incident light from entering the peripheral region 105 while increasing incident light disposed on the pixel region 103 of the semiconductor substrate 104.

Figure 5C:
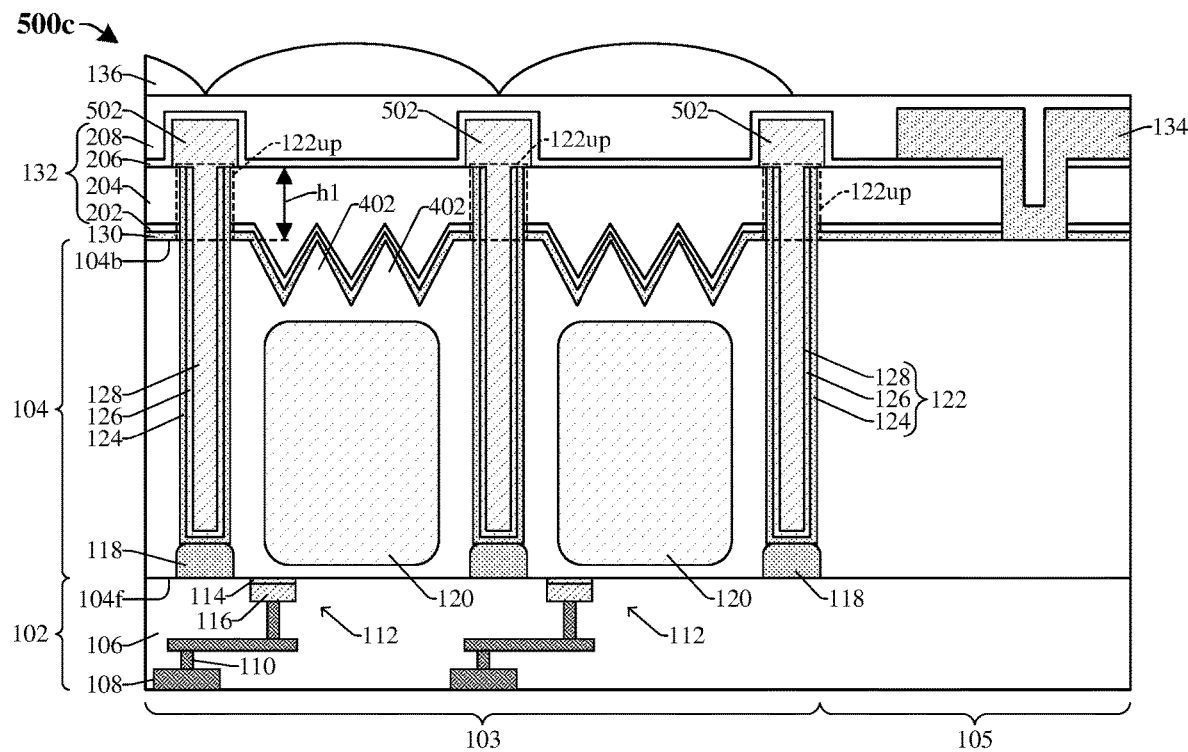

FIG. 5C illustrates a cross-sectional view 500c of some alternative embodiments of the image sensor of FIG. 5A, in which the metal grid structure 502 and the trench fill layer 128 comprise a same material (e.g., a metal material such as tungsten, aluminum, etc.) and are a single continuous structure. In some embodiments, the metal grid structure 502 and the trench fill layer 128 are formed by a single deposition process.

Figure 5D:
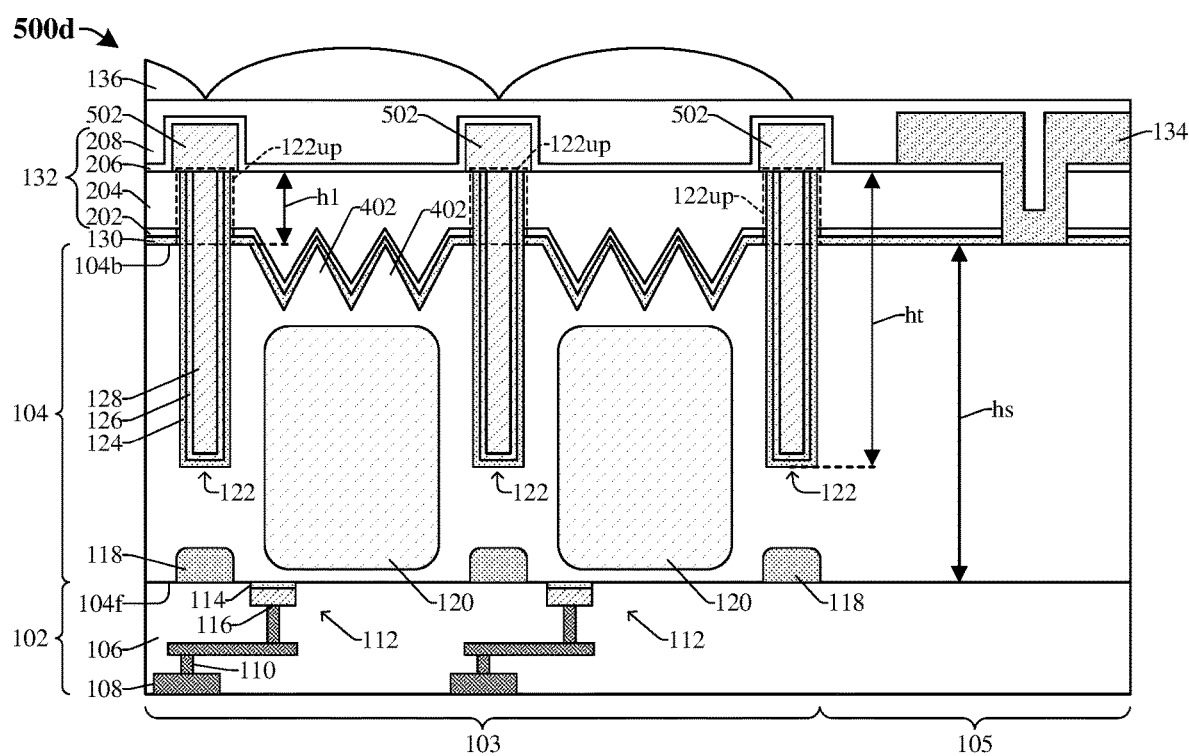

FIG. 5D illustrates a cross-sectional view 500d of some alternative embodiments of the image sensor of FIG. 5A, in which the height ht of the isolation structure 122 is less than the height hs of the semiconductor substrate 104.

FIGS. 6-17 illustrate cross-sectional views 600-1700 of some embodiments of a method of forming an image sensor comprising an isolation structure protruding above a semiconductor substrate into an upper dielectric structure. Although the cross-sectional views 600-1700 shown in FIGS. 6-17 are described with reference to a method, it will be appreciated that the structures shown in FIGS. 6-17 are not limited to the method but rather may stand alone separate of the method. Furthermore, although FIGS. 6-17 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
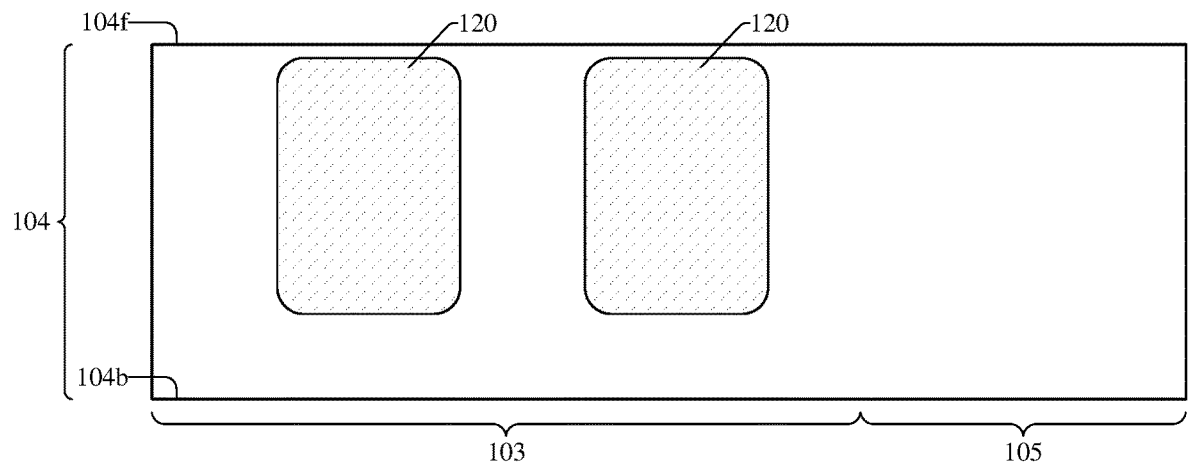
FIGS. 6-17 illustrate cross-sectional views of some embodiments of a method of forming an image sensor comprising an isolation structure protruding above a semiconductor substrate into an upper dielectric structure.

As shown in cross-sectional view 600 of FIG. 6, a semiconductor substrate 104 is provided and a plurality of photodetectors 120 is formed in a pixel region 103 of the semiconductor substrate 104. The semiconductor substrate 104 may, for example, be or comprise monocrystalline silicon, epitaxial silicon, germanium, silicon-germanium, a silicon-on-insulator (SOI) substrate, another semiconductor material, any combination of the foregoing, or the like. In some embodiments, the semiconductor substrate 104 has a first doping type (e.g., p-type). In various embodiments, each photodetector 120 comprises a region of the semiconductor substrate 104 having a second doping type (e.g., n-type) opposite the first doping type (e.g., p-type). In some embodiments, the photodetectors 120 may be formed by a selective ion implantation process that utilizes a masking layer (not shown) on a front-side surface 104f of the semiconductor substrate 104 to selectively implant ions into the semiconductor substrate 104.

Figure 7:
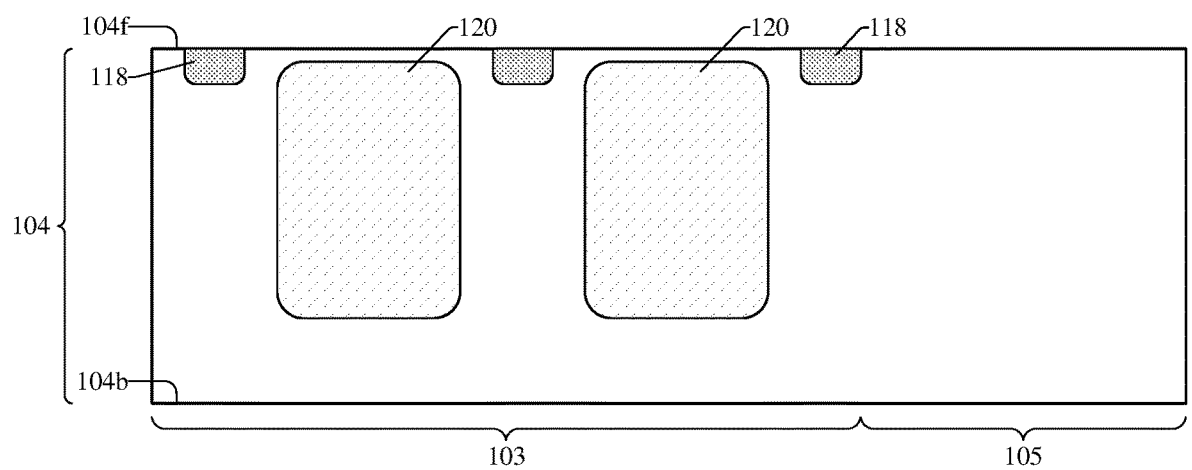

As shown in cross-sectional view 700 of FIG. 7, a shallow trench isolation (STI) structure 118 is formed in the front-side surface 104f of the semiconductor substrate 104. The STI structure 118 may, for example, be or comprise silicon oxide, silicon nitride, silicon carbide, silicon oxynitride, silicon oxycarbide, another suitable dielectric material, or any combination of the foregoing. In various embodiments, a method for forming the STI structure 118 comprises: pattering the front-side surface 104f of the semiconductor substrate 104 to form a trench extending into the front-side surface 104f; depositing (e.g., by chemical vapor deposition (CVD), physical vapor deposition (PVD), atomic layer deposition (ALD), thermal oxidation, etc.) a dielectric material in the trench; and performing a planarization process (e.g., an etch process, a chemical mechanical planarization (CMP) process, etc.) on the dielectric material.

Figure 8:
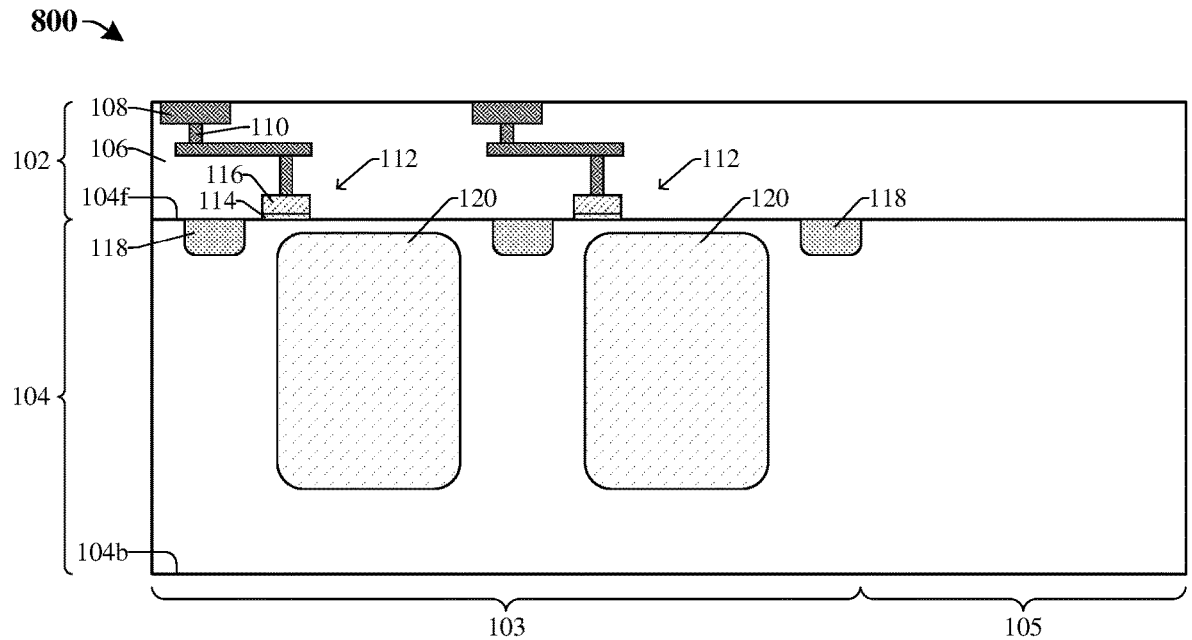

As shown in cross-sectional view 800 of FIG. 8, a plurality of pixel devices 112 and an interconnect structure 102 are formed on the front-side surface 104f of the semiconductor substrate 104. In some embodiments, each of the pixel devices 112 comprise a gate electrode 116 and a gate dielectric layer 114 disposed between the gate electrode 116 and the semiconductor substrate 104. In some embodiments, a process for forming the pixel devices 112 comprises: depositing (e.g., by CVD, PVD, ALD, etc.) a gate dielectric material over the semiconductor substrate 104; depositing (e.g., by CVD, PVD, ALD, electroplating, electroless plating, etc.) a gate electrode material over the gate dielectric material; and patterning the gate electrode material and the gate dielectric material.

Further, the interconnect structure comprises an interconnect dielectric structure 106, a plurality of conductive wires 108, and a plurality of conductive vias 110. In various embodiments, the interconnect dielectric structure 106 may be formed by one or more deposition process(es) such as a PVD process, a CVD process, an ALD process, or another suitable growth or deposition process. In some embodiments, the plurality of conductive wires 108 and/or the plurality of conductive vias 110 may be formed by one or more deposition process(es), one or more patterning process(es), one or more planarization process(es), some other suitable process(es), or any combination of the foregoing. For example, the plurality of conductive wires 108 and the plurality of conductive vias 110 may be formed by one or more single damascene processes, one or more dual damascene process, other fabrication process(es), or any combination of the foregoing.

Figure 9:
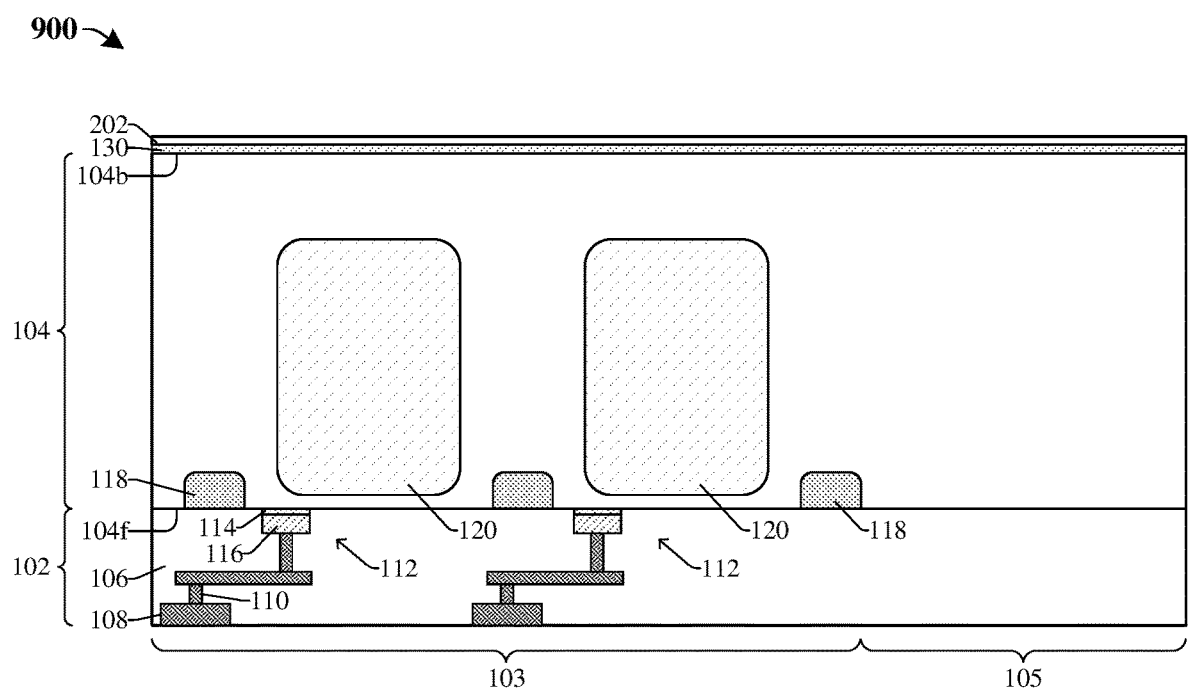

As shown in cross-sectional view 900 of FIG. 9, a passivation layer 130 is deposited on a back-side surface 104b of the semiconductor substrate 104 and a first dielectric layer 202 is deposited on the passivation layer 130. In some embodiments, the passivation layer 130 and the first dielectric layer 202 deposited by a CVD process, a PVD process, an ALD process, or another suitable growth or deposition process. In some embodiments, the passivation layer 130 comprises a high-k dielectric material and the first dielectric layer 202 comprises an oxide (e.g., silicon dioxide) with a lower dielectric constant than the passivation layer 130.

Figure 10:
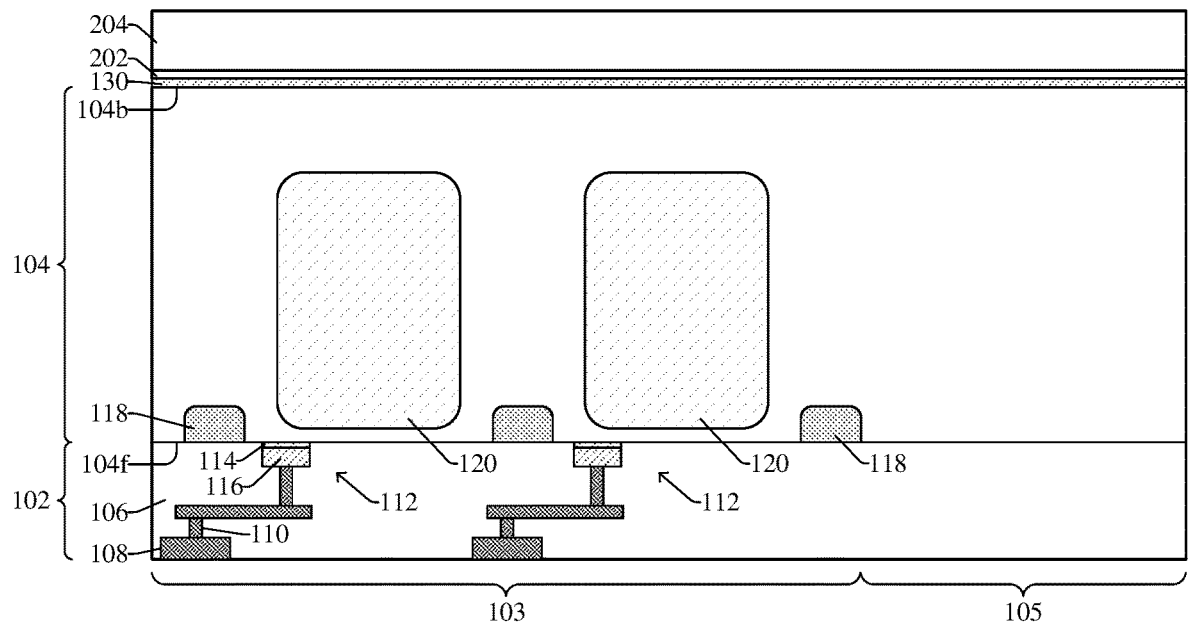

As shown in cross-sectional view 1000 of FIG. 10, a second dielectric layer 204 is deposited on the first dielectric layer 202. In some embodiments the second dielectric layer 204 is deposited by a CVD process, a PVD process, an ALD process, or another suitable growth or deposition process. In further embodiments, a planarization process (e.g., a CMP process) is performed on the second dielectric layer 204 such that a top surface of the second dielectric layer 204 is substantially flat. In yet further embodiments, a thickness of the second dielectric layer 204 is greater than a thickness of the first dielectric layer 202 and is greater than a thickness of the passivation layer 130.

Figure 11:
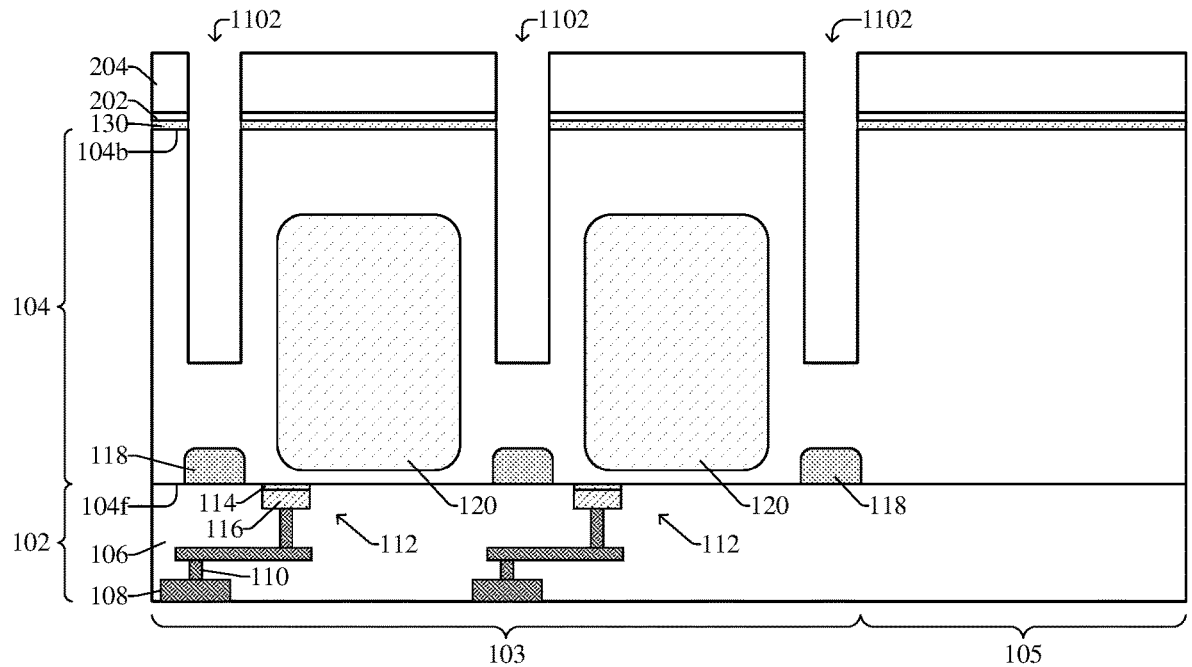

As shown in cross-sectional view 1100 of FIG. 11, a patterning process is performed on the back-side surface 104b of the semiconductor substrate 104 to form an isolation opening 1102 extending into the back-side surface 104b. In some embodiments, the patterning process includes: forming a masking layer (not shown) over the second dielectric layer 204; etching (e.g., by a dry etch process, a wet etch process, etc.) the semiconductor substrate 104 according to the masking layer; and removing the masking layer.

Figure 12:
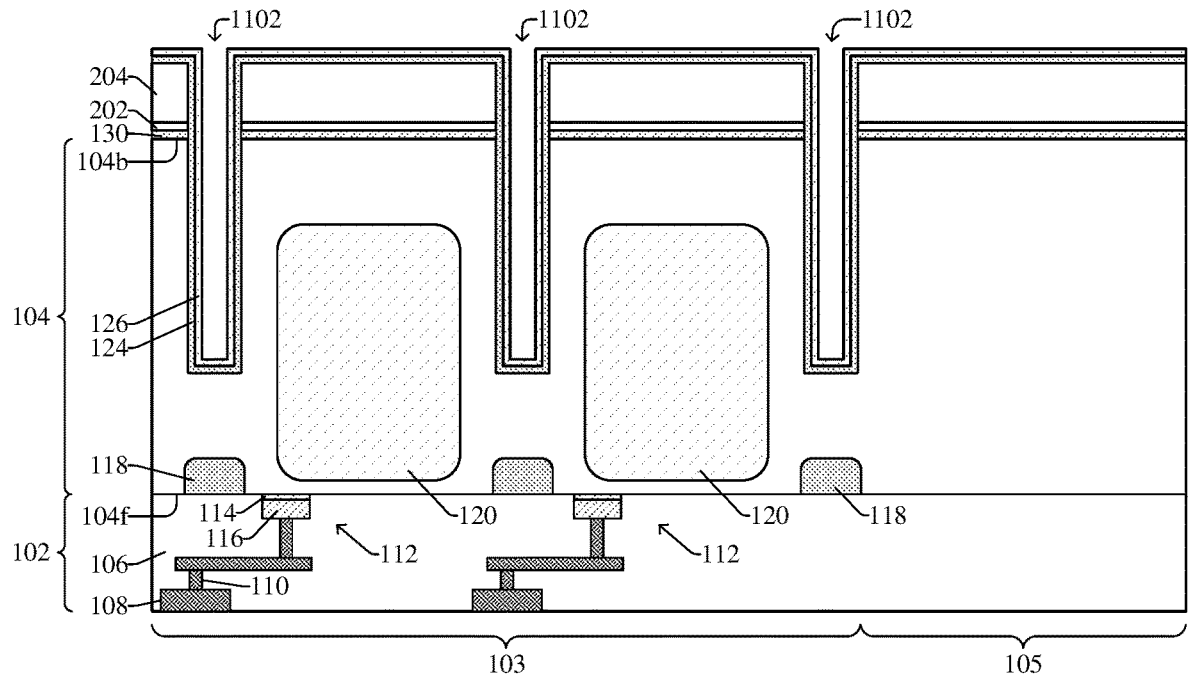

As shown in cross-sectional view 1200 of FIG. 12, a first liner layer 124 is deposited over the semiconductor substrate 104 lining the isolation opening 1102 and a second liner layer 126 is deposited over the first liner layer 124. In some embodiments, the first liner layer 124 and the second liner layer 126 are respectively deposited by a CVD process, a PVD process, an ALD process, or some other suitable growth or deposition process. The first liner layer 124 may, for example, be or comprise a high-k dielectric material such as aluminum oxide, hafnium oxide, titanium oxide, another high-k dielectric material, another dielectric material, or any combination of the foregoing. The second liner layer 126 may, for example, be or comprise silicon dioxide, another suitable dielectric material, or the like.

Figure 13:
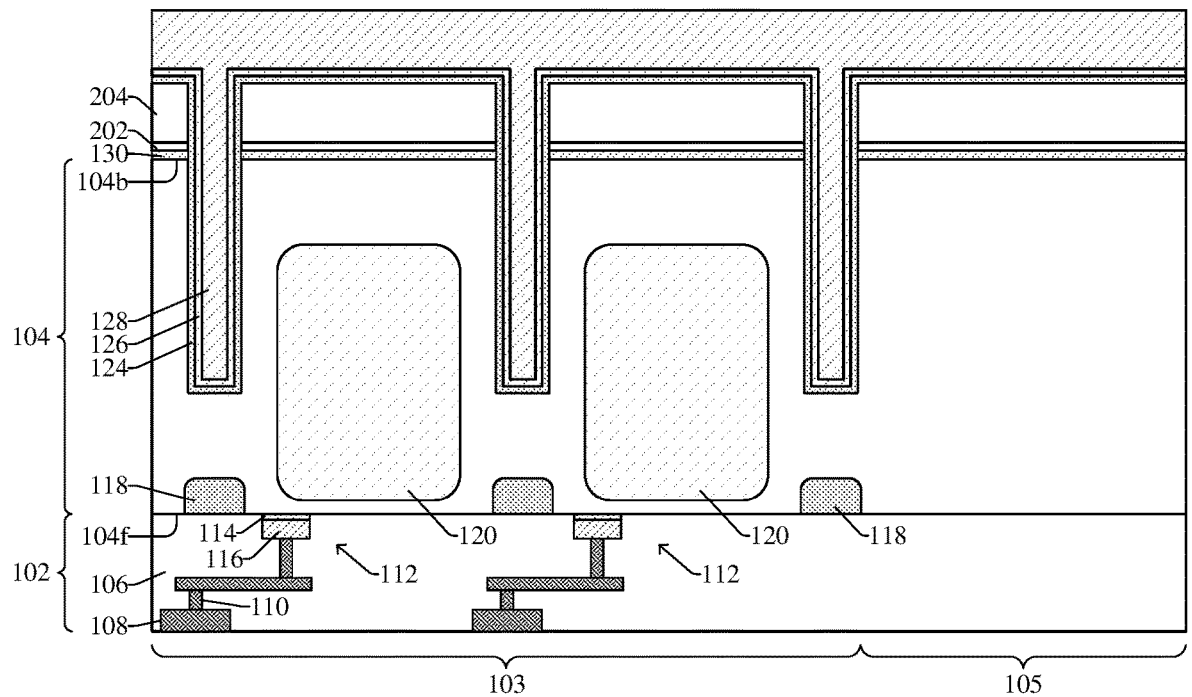

As shown in cross-sectional view 1300 of FIG. 13, a trench fill layer 128 is deposited over the second liner layer 126 and within the isolation opening (1102 of FIG. 12). In various embodiments, the trench fill layer 128 is deposited over the second liner layer 126 by a CVD process, a PVD process, an ALD process, electroplating, electroless plating, or another suitable growth or deposition process. The trench fill layer 128 may, for example, be or comprise polysilicon, doped polysilicon, a metal such as tungsten, aluminum, another metal material, or any combination of the foregoing. In some embodiments, before depositing the trench fill layer 128 a blanket etch process may be performed to remove portions of the second liner layer 126 and/or the first liner layer 124 disposed on the top surface of the second dielectric layer 204 (not shown). In various embodiments, after the blanket etch process top surfaces of the first and second liner layers 124, 126 are aligned with the top surface of the second dielectric layer 204 (e.g., as illustrated in FIG. 2).

Figure 14:
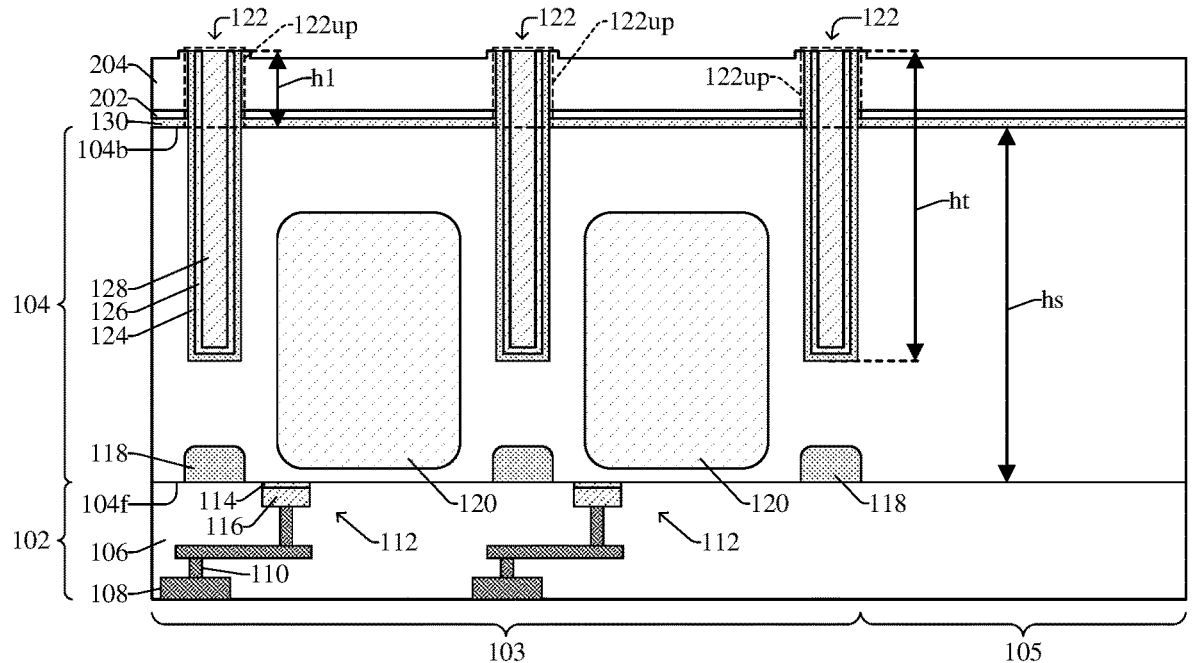

As shown in cross-sectional view 1400 of FIG. 14, a removal process is performed to remove excess materials from over the second dielectric layer 204, thereby forming an isolation structure 122 extending into the semiconductor substrate 104. In some embodiments, the removal process includes performing an etch process into the first liner layer 124, the second liner layer 126, and/or the trench fill layer 128 to remove the excess materials from over the second dielectric layer 204. In various embodiments, the etch process comprises a dry etch, a blanket etch, or the like. The etch process may over etch and remove at least a portion of the second dielectric layer 204. In yet further embodiments, the removal process includes performing a CMP process into the first liner layer 124, the second liner layer 126, and/or the trench fill layer 128 until a top surface of the second dielectric layer 204 is reached. In various embodiments, a top surface of the isolation structure 122 is co-planar with a top surface of the second dielectric layer 204. Further, the removal process is performed such that the isolation structure 122 comprises an upper portion 122up extending above the semiconductor substrate 104 and having a height h1. In various embodiments, the height h1 of the upper portion 122up of the isolation structure 122 is within a range of about 800 angstroms to about 1300 angstroms, within a range of about 800 angstroms to about 1050 angstroms, within a range of about 1050 angstroms to about 1300 angstroms, or some other suitable value. In yet further embodiments, a height ht of the isolation structure 122 is less than a height hs of the semiconductor substrate 104.

Figure 15:
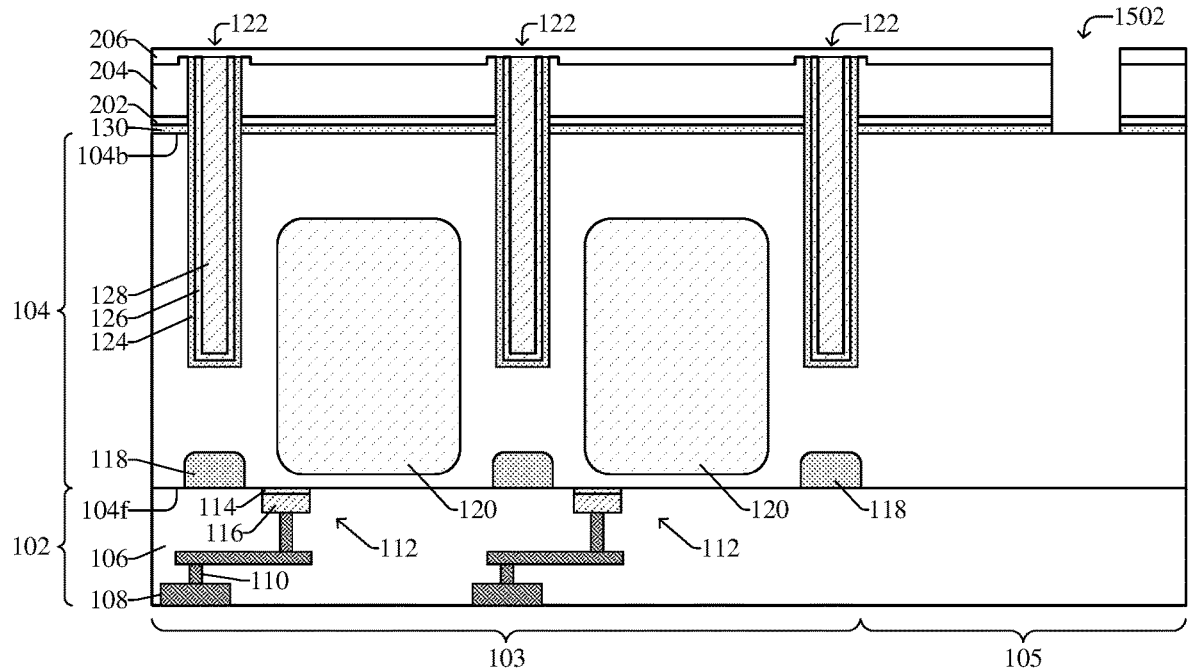

As shown in cross-sectional view 1500 of FIG. 15, a third dielectric layer 206 is deposited over the isolation structure 122 and a patterning process is performed to form an opening 1502 in a peripheral region 105 of the semiconductor substrate 104. In some embodiments, the third dielectric layer 206 is deposited by a CVD process, a PVD process, an ALD process, or some other suitable growth or deposition process. In various embodiments, the patterning process comprises: forming a masking layer (not shown) over the third dielectric layer 206; performing an etching process (e.g., a dry etch, a wet etch, etc.) according to the masking layer; and removing the masking layer. The opening 1502 exposes a portion of the back-side surface 104b of the semiconductor substrate 104 in the peripheral region 105.

Figure 16:
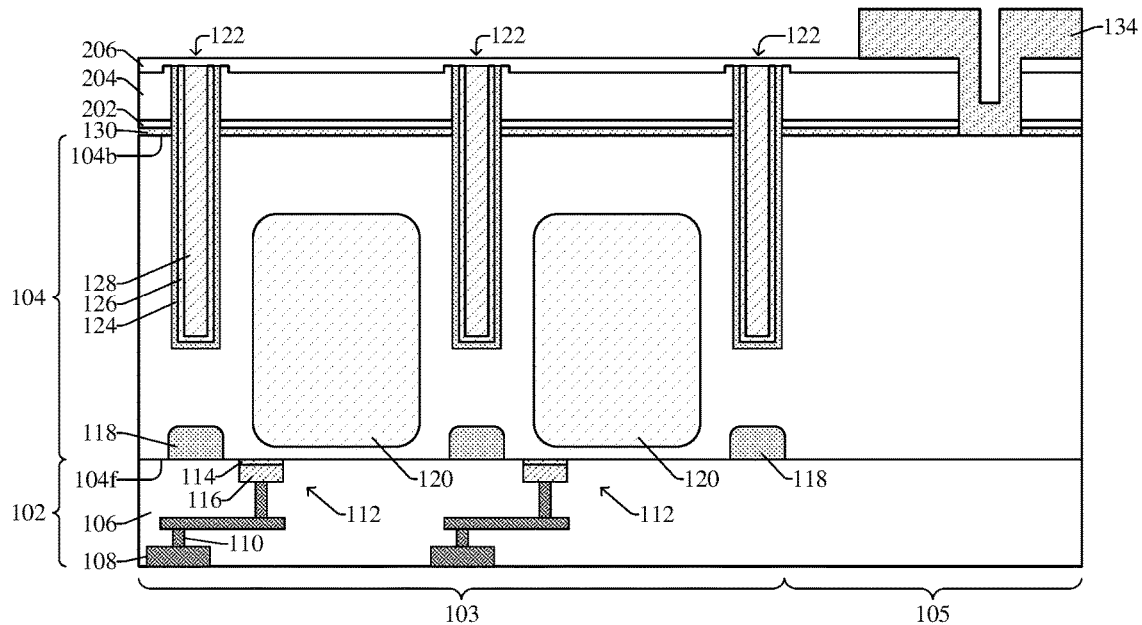

As shown in cross-sectional view 1600 of FIG. 16, a conductive pad 134 is formed within the opening (1502 of FIG. 15) and on the back-side surface 104b of the semiconductor substrate 104 in the peripheral region 105. In some embodiments, a process for forming the conductive pad 134 includes depositing (e.g., by CVD, PVD, ALD, electroplating, electroless plating, etc.) a conductive material over the semiconductor substrate 104 and within the opening (1502 of FIG. 15) and patterning the conductive material. The conductive pad 134 may, for example, be or comprise aluminum, copper, titanium, tungsten, another conductive material, or any combination of the foregoing. In various embodiments, the trench fill layer 128 comprises a first metal material and the conductive pad 134 comprises a second metal material different from the first metal material.

Figure 17:
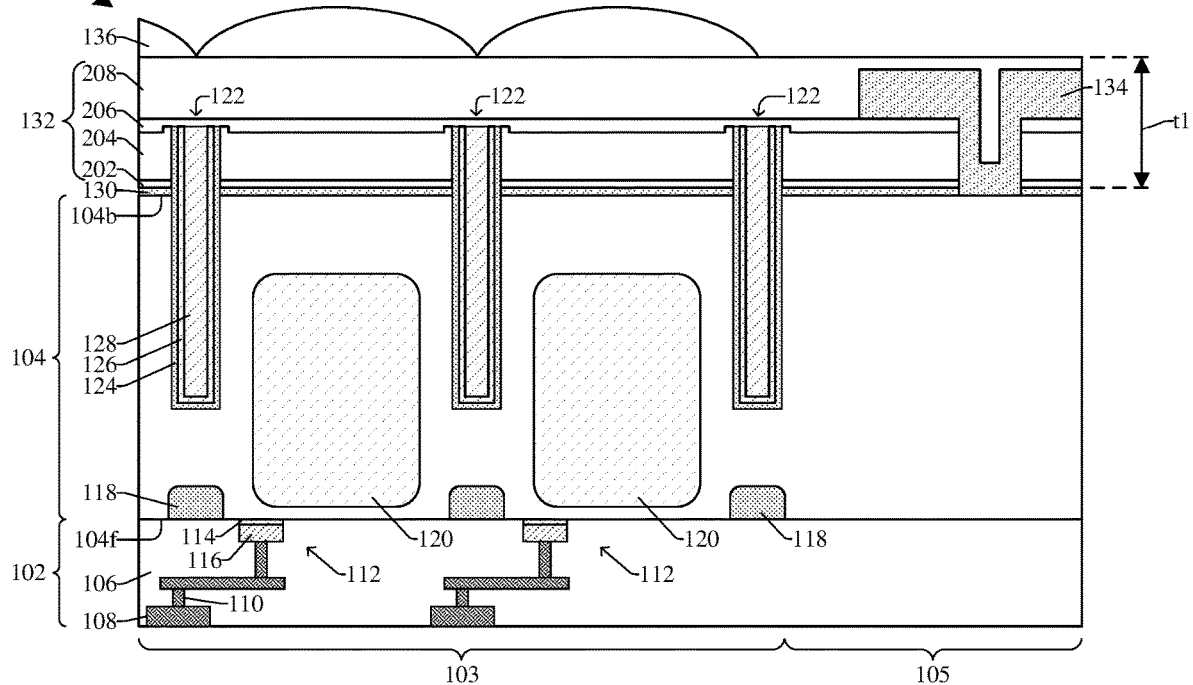

As shown in cross-sectional view 1700 of FIG. 17, a fourth dielectric layer 208 is formed over the third dielectric layer 206 and the conductive pad 134, thereby forming an upper dielectric structure 132. Further a plurality of microlenses 136 is formed on the fourth dielectric layer 208. The upper dielectric structure 132 comprises the first dielectric layer 202, the second dielectric layer 204, the third dielectric layer 206, and the fourth dielectric layer 208. In some embodiments, a planarization process (e.g., a CMP process) is performed on the fourth dielectric layer 208 such that the upper dielectric structure 132 has a thickness t1. In some embodiments, the thickness t1 is about 4700 angstroms, within a range of about 3000 angstroms to about 6000 angstroms, or some other suitable value.

FIGS. 18-25 illustrate cross-sectional views 1800-2500 of some embodiments of a method of forming an image sensor comprising an isolation structure protruding above a semiconductor substrate into an upper dielectric structure. Although the cross-sectional views 1800-2500 shown in FIGS. 18-25 are described with reference to a method, it will be appreciated that the structures shown in FIGS. 18-25 are not limited to the method but rather may stand alone separate of the method. Furthermore, although FIGS. 18-25 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 18:
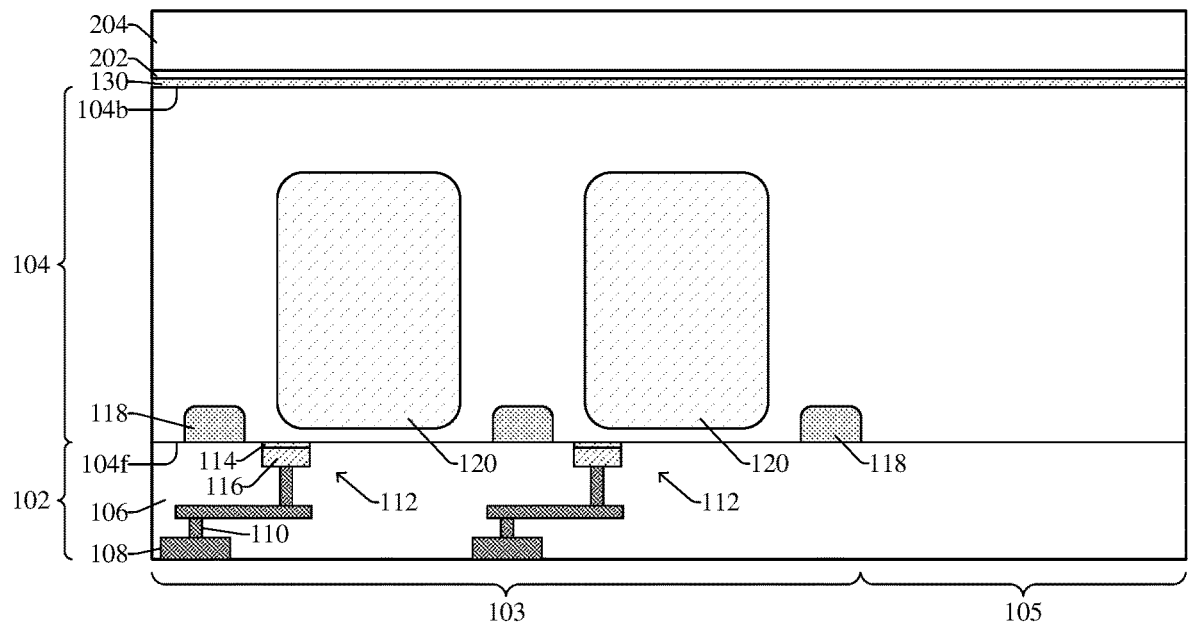
FIGS. 18-25 illustrate cross-sectional views of various embodiments of a method of forming an image sensor comprising an isolation structure protruding above a semiconductor substrate into an upper dielectric structure.

As shown in cross-sectional view 1800 of FIG. 18, a passivation layer 130, a first dielectric layer, and a second dielectric layer 204 are formed on a back-side surface 104*b* of a semiconductor substrate 104. In some embodiments, the structure of FIG. 18 is formed as illustrated and/or described in FIGS. 6-10.

Figure 19:
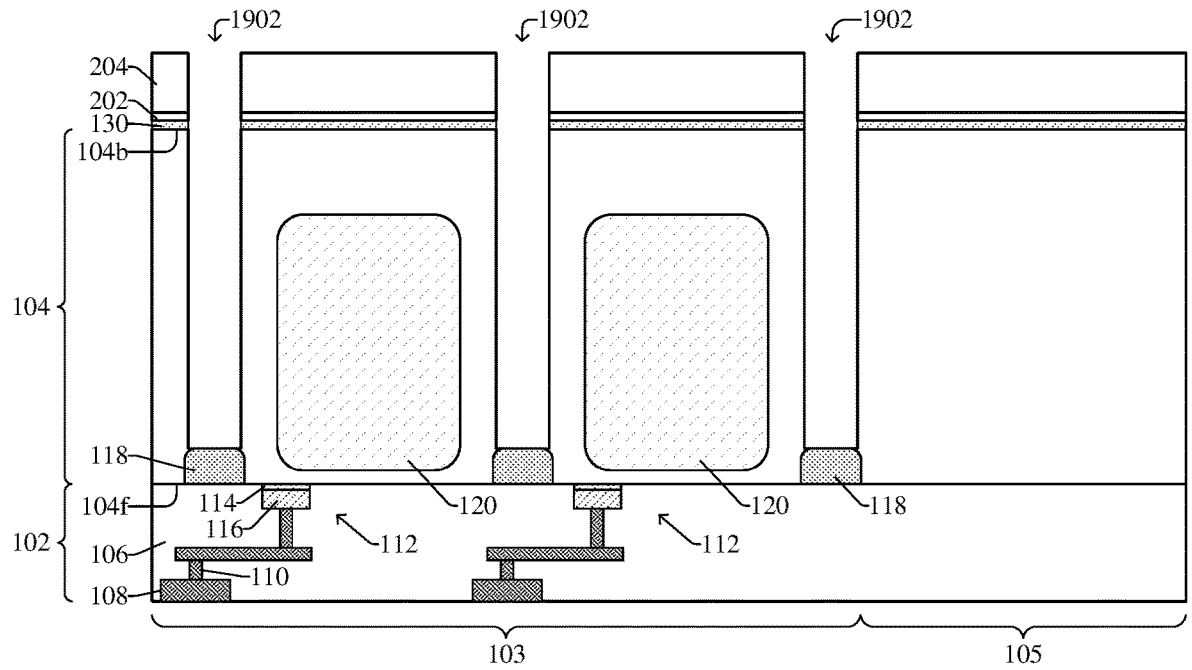

As shown in cross-sectional view 1900 of FIG. 19, a patterning process is performed on the back-side surface 104*b* of the semiconductor substrate 104 to form an isolation opening 1902 extending into the back-side surface 104*b*. In some embodiments, the patterning process includes: forming a masking layer (not shown) over the second dielectric layer 204; etching (e.g., by a dry etch process, a wet etch process, etc.) the semiconductor substrate 104 according to the masking layer; and removing the masking layer. In various embodiments, the patterning process is performed until a top surface of the STI structure 118 is reached.

Figure 20:
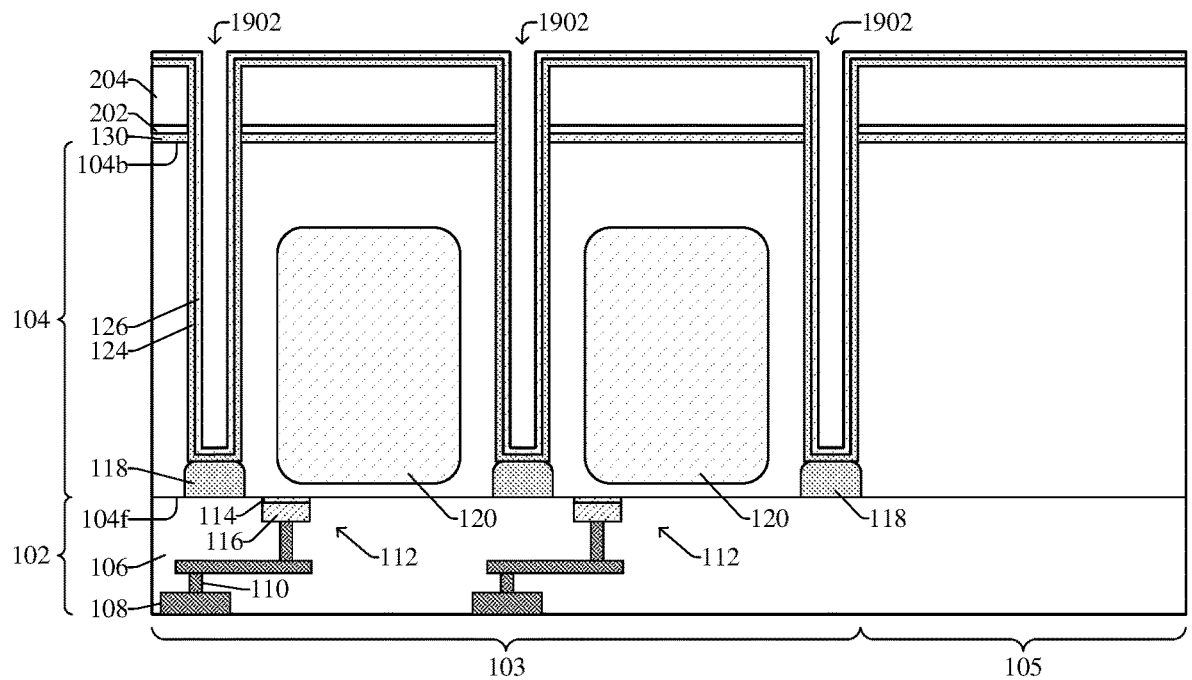

As shown in cross-sectional view 2000 of FIG. 20, a first liner layer 124 is deposited over the semiconductor substrate 104 lining the isolation opening 1902 and a second liner layer 126 is deposited over the first liner layer 124. In some embodiments, the first liner layer 124 and the second liner layer 126 are respectively deposited by a CVD process, a PVD process, an ALD process, or some other suitable growth or deposition process. The first liner layer 124 may, for example, be or comprise a high-k dielectric material such as aluminum oxide, hafnium oxide, titanium oxide, another high-k dielectric material, another dielectric material, or any combination of the foregoing. The second liner layer 126 may, for example, be or comprise silicon dioxide, another suitable dielectric material, or the like.

Figure 21:
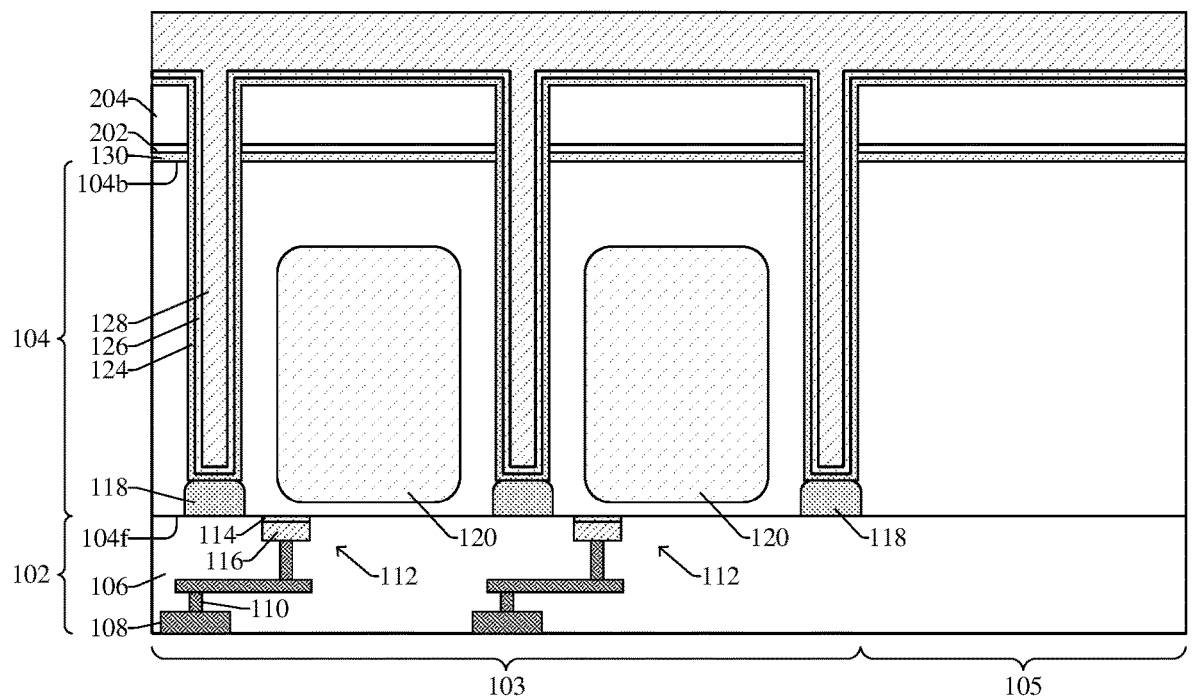

As shown in cross-sectional view 2100 of FIG. 21, a trench fill layer 128 is deposited over the second liner layer 126 and within the isolation opening (1902 of FIG. 20). In various embodiments, the trench fill layer 128 is deposited over the second liner layer 126 by a CVD process, a PVD process, an ALD process, electroplating, electroless plating, or another suitable growth or deposition process. The trench fill layer 128 may, for example, be or comprise polysilicon, doped polysilicon, a metal such as tungsten, aluminum, another metal material, or any combination of the foregoing. In some embodiments, before depositing the trench fill layer 128 a blanket etch process may be performed to remove portions of the second liner layer 126 and/or the first liner layer 124 disposed on the top surface of the second dielectric layer 204 (not shown). In various embodiments, after the blanket etch process top surfaces of the first and second liner layers 124, 126 are aligned with the top surface of the second dielectric layer 204 (e.g., as illustrated in FIG. 2).

Figure 22:
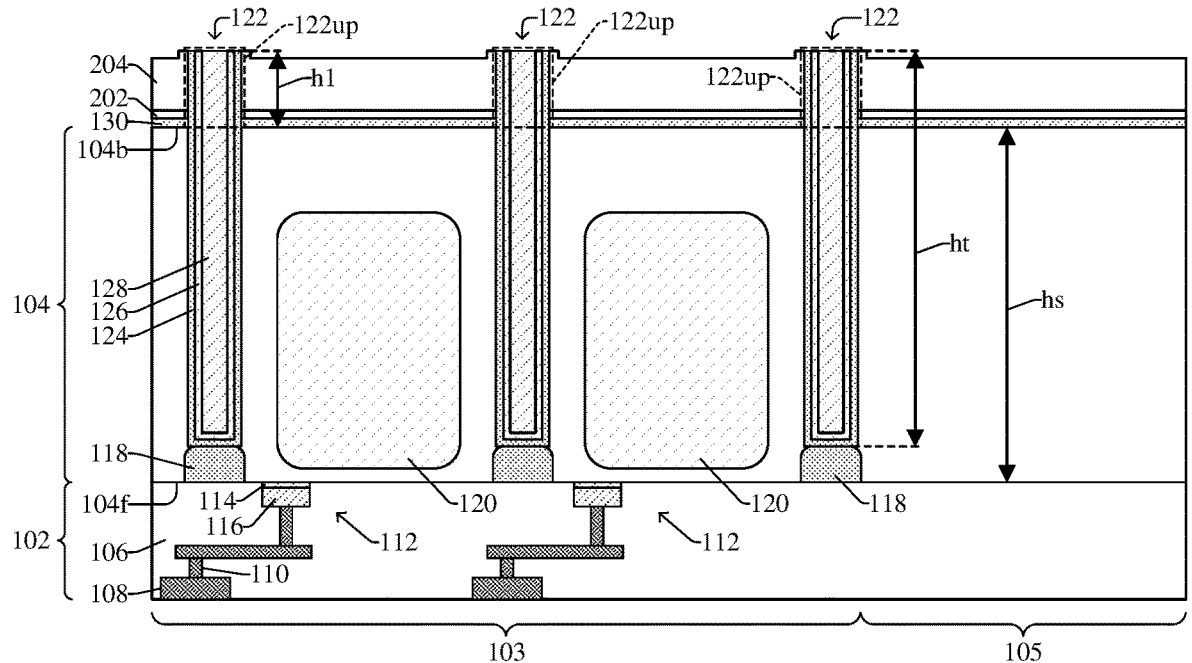

As shown in cross-sectional view 2200 of FIG. 22, a removal process is performed to remove excess materials from over the second dielectric layer 204, thereby forming an isolation structure 122 extending into the semiconductor substrate 104. In some embodiments, the removal process includes performing an etch process into the first liner layer 124, the second liner layer 126, and/or the trench fill layer 128 to remove the excess materials from over the second dielectric layer 204. In various embodiments, the etch process comprises a dry etch, a blanket etch, or the like. The etch process may over etch and remove at least a portion of the second dielectric layer 204. In yet further embodiments, the removal process includes performing a CMP process into the first liner layer 124, the second liner layer 126, and/or the trench fill layer 128 until a top surface of the second dielectric layer 204 is reached. In various embodiments, a top surface of the isolation structure 122 is co-planar with a top surface of the second dielectric layer 204. Further, the removal process is performed such that the isolation structure 122 comprises an upper portion 122*up* extending above the semiconductor substrate 104 and having a height h1. In various embodiments, the height h1 of the upper portion 122*up* of the isolation structure 122 is within a range of about 800 angstroms to about 1300 angstroms, within a range of about 800 angstroms to about 1050 angstroms, within a range of about 1050 angstroms to about 1300 angstroms, or some other suitable value. In yet further embodiments, a height ht of the isolation structure 122 is greater than a height hs of the semiconductor substrate 104.

Figure 23:
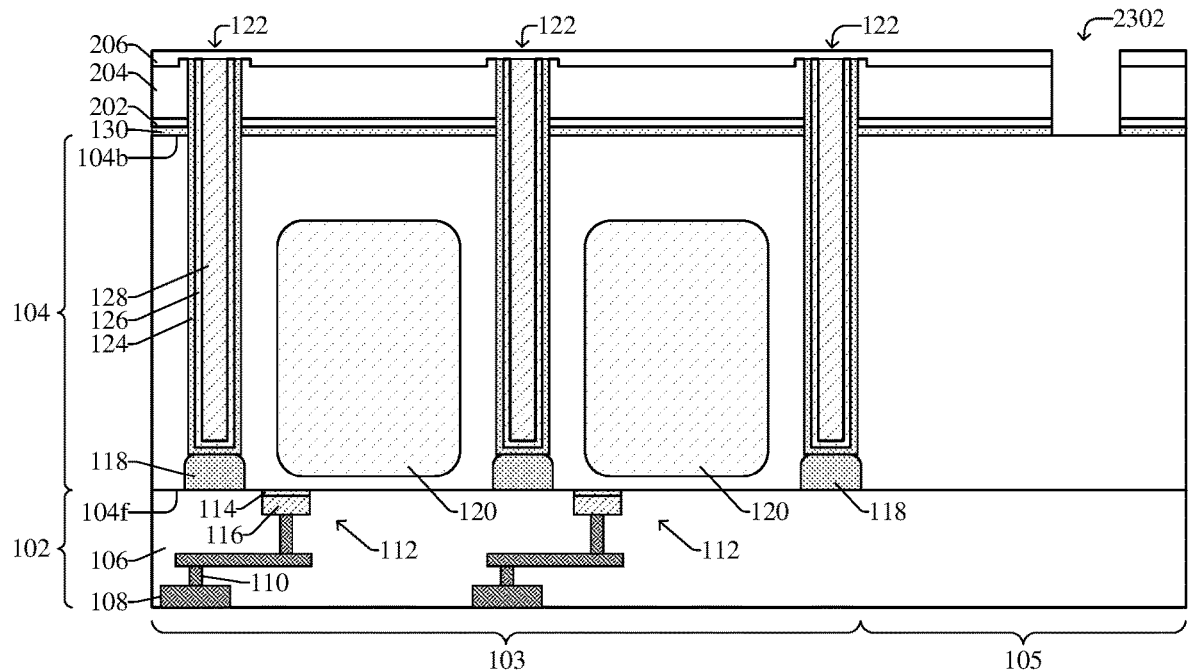

As shown in cross-sectional view 2300 of FIG. 23, a third dielectric layer 206 is deposited over the isolation structure 122 and a patterning process is performed to form an opening 2302 in a peripheral region 105 of the semiconductor substrate 104. In some embodiments, the third dielectric layer 206 is deposited by a CVD process, a PVD process, an ALD process, or some other suitable growth or deposition process. In various embodiments, the patterning process comprises: forming a masking layer (not shown) over the third dielectric layer 206; performing an etching process (e.g., a dry etch, a wet etch, etc.) according to the masking layer; and removing the masking layer. The opening 2302 exposes a portion of the back-side surface 104*b* of the semiconductor substrate 104 in the peripheral region 105.

Figure 24:
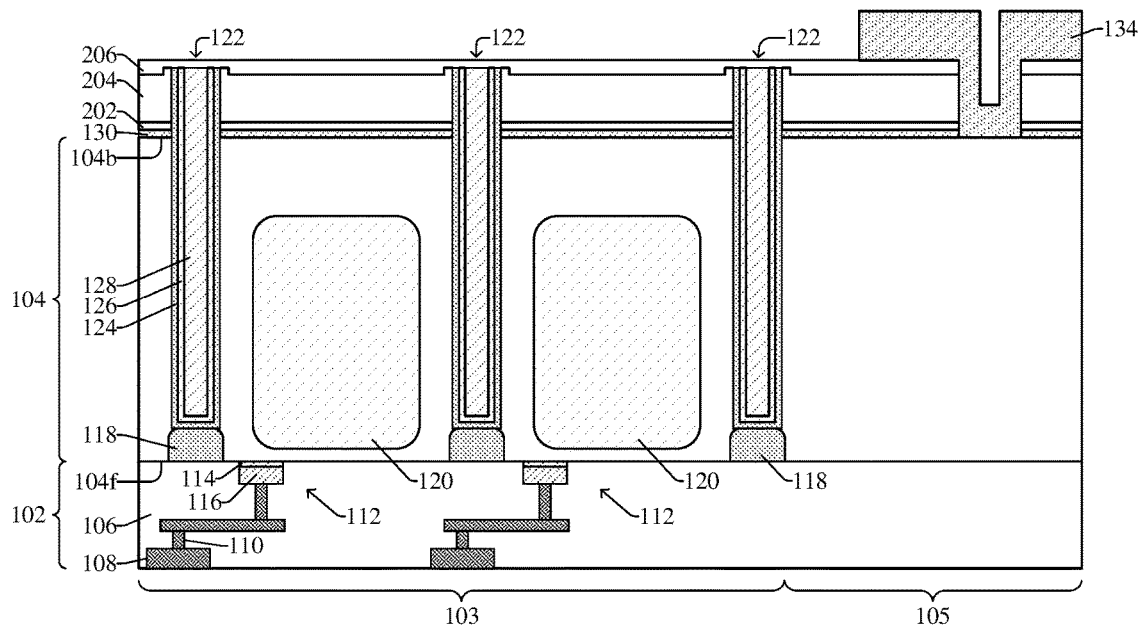

As shown in cross-sectional view 2400 of FIG. 24, a conductive pad 134 is formed within the opening (2302 of FIG. 23) and on the back-side surface 104*b* of the semiconductor substrate 104 in the peripheral region 105. In some embodiments, a process for forming the conductive pad 134 includes depositing (e.g., by CVD, PVD, ALD, electroplating, electroless plating, etc.) a conductive material over the semiconductor substrate 104 and within the opening (2302 of FIG. 23) and patterning the conductive material. The conductive pad 134 may, for example, be or comprise aluminum, copper, titanium, tungsten, another conductive material, or any combination of the foregoing. In various embodiments, the trench fill layer 128 comprises a first metal material and the conductive pad 134 comprises a second metal material different from the first metal material.

Figure 25:
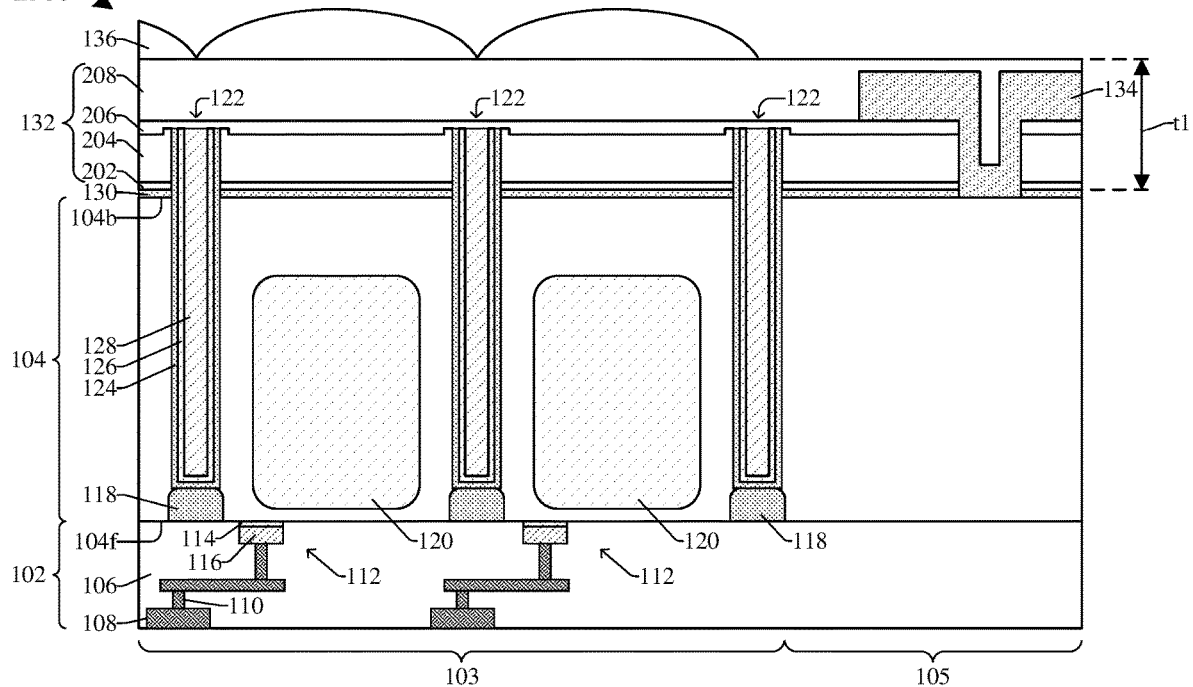

As shown in cross-sectional view 2500 of FIG. 25, a fourth dielectric layer 208 is formed over the third dielectric layer 206 and the conductive pad 134, thereby forming an upper dielectric structure 132. Further a plurality of microlenses 136 is formed on the fourth dielectric layer 208. The upper dielectric structure 132 comprises the first dielectric layer 202, the second dielectric layer 204, the third dielectric layer 206, and the fourth dielectric layer 208. In some embodiments, a planarization process (e.g., a CMP process) is performed on the fourth dielectric layer 208 such that the upper dielectric structure 132 has a thickness t1. In some embodiments, the thickness t1 is about 4700 angstroms, within a range of about 3000 angstroms to about 6000 angstroms, or some other suitable value.

FIGS. 26-36 illustrate cross-sectional views 2600-3600 of some embodiments of a method of forming an image sensor comprising an isolation structure protruding above a semiconductor substrate into an upper dielectric structure. Although the cross-sectional views 2600-3600 shown in FIGS. 26-36 are described with reference to a method, it will be appreciated that the structures shown in FIGS. 26-36 are not limited to the method but rather may stand alone separate of the method. Furthermore, although FIGS. 26-36 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 26:
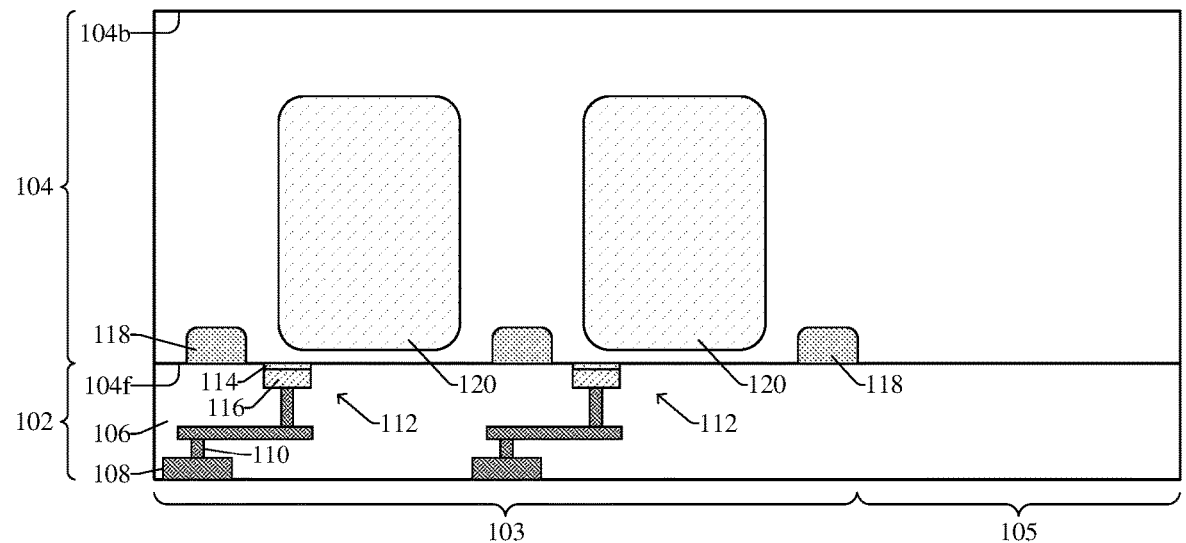
FIGS. 26-36 illustrate cross-sectional views of some other embodiments of a method of forming an image sensor comprising an isolation structure protruding above a semiconductor substrate into an upper dielectric structure.

As shown in cross-sectional view 2600 of FIG. 26, a plurality of photodetectors 120 is formed within a semiconductor substrate 104 and a plurality of pixel devices 112 and an interconnect structure 102 are formed on a front-side surface 104f of the semiconductor substrate 104. In some embodiments, the structure of FIG. 26 is formed as illustrated and/or described in FIGS. 6-8.

Figure 27:
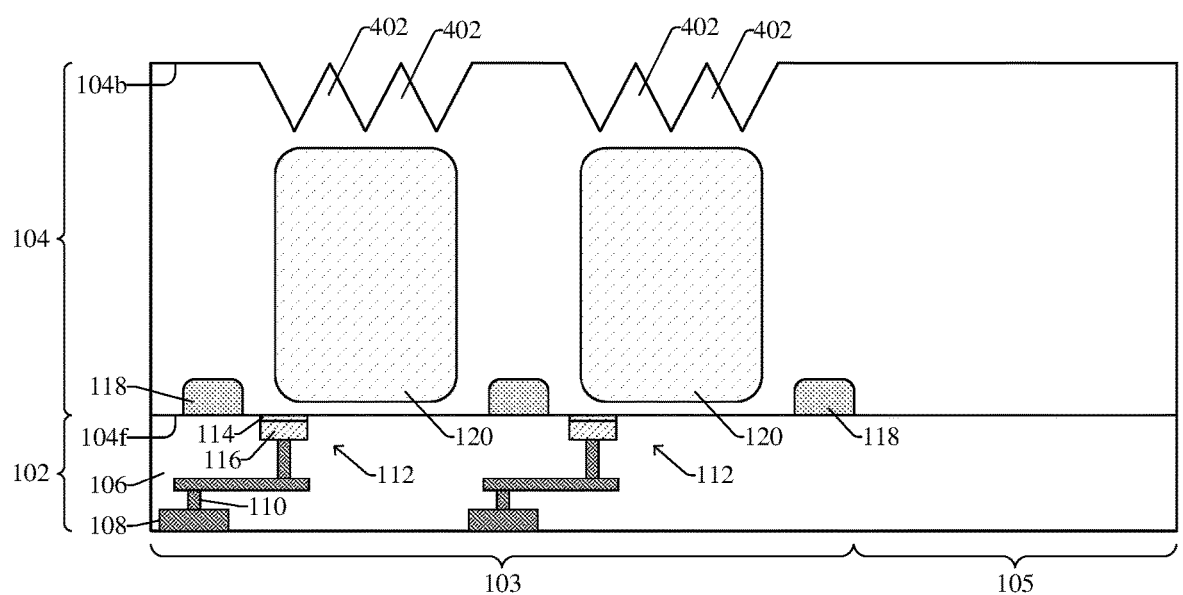

As shown in cross-sectional view 2700 of FIG. 27, an etching process is performed on the back-side surface 104b of the semiconductor substrate 104 to form a plurality of protrusions 402 over the photodetectors 120. In some embodiments, the etching process includes a wet etch, a dry etch, another suitable etch, or any combination of the foregoing. In various embodiments, the etching process comprises: forming a masking layer (not shown) over the back-side surface 104b; etching (e.g., by a dry etch process, a wet etch process, etc.) the semiconductor substrate 104 according to the masking layer; and removing the masking layer.

Figure 28:
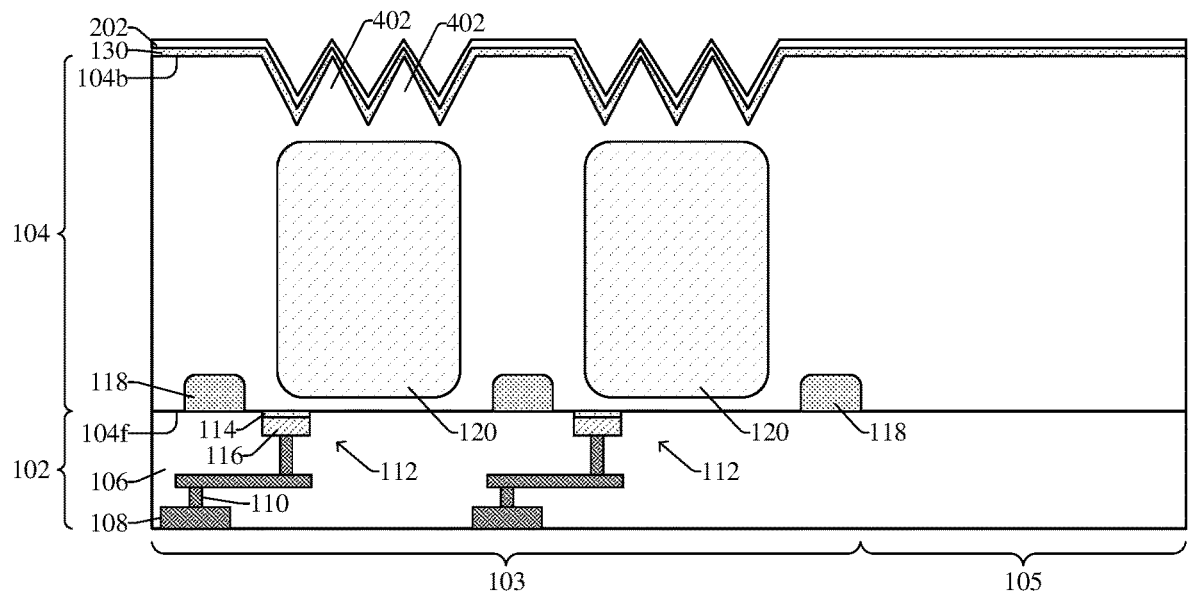

As shown in cross-sectional view 2800 of FIG. 28, a passivation layer 130 is deposited on the back-side surface 104b of the semiconductor substrate 104 and a first dielectric layer 202 is deposited on the passivation layer 130. The passivation layer 130 and the first dielectric layer 202 are deposited by a conformal deposition process and conform to a shape of the protrusions 402. In some embodiments, the passivation layer 130 and the first dielectric layer 202 deposited by a CVD process, a PVD process, an ALD process, or another suitable growth or deposition process. In some embodiments, the passivation layer 130 comprises a high-k dielectric material and the first dielectric layer 202 comprises an oxide (e.g., silicon dioxide) with a lower dielectric constant than the passivation layer 130.

Figure 29:
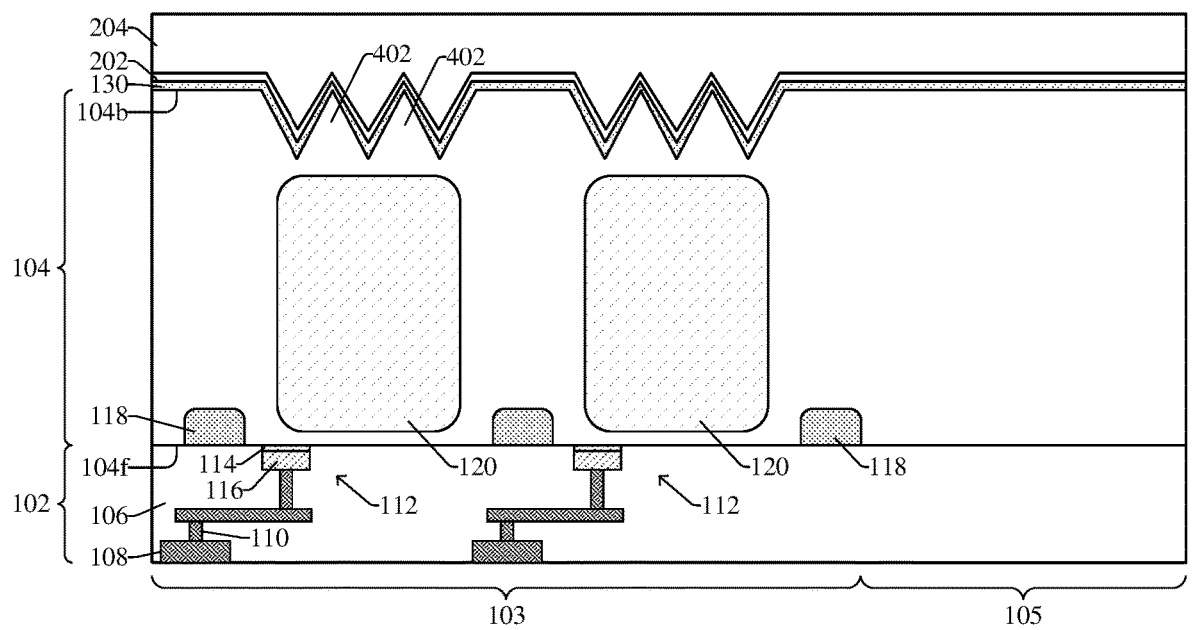

As shown in cross-sectional view 2900 of FIG. 29, a second dielectric layer 204 is deposited on the first dielectric layer 202. In some embodiments the second dielectric layer 204 is deposited by a CVD process, a PVD process, an ALD process, or another suitable growth or deposition process. In further embodiments, a planarization process (e.g., a CMP process) is performed on the second dielectric layer 204 such that a top surface of the second dielectric layer 204 is substantially flat. In yet further embodiments, a thickness of the second dielectric layer 204 is greater than a thickness of the first dielectric layer 202 and is greater than a thickness of the passivation layer 130.

Figure 30:
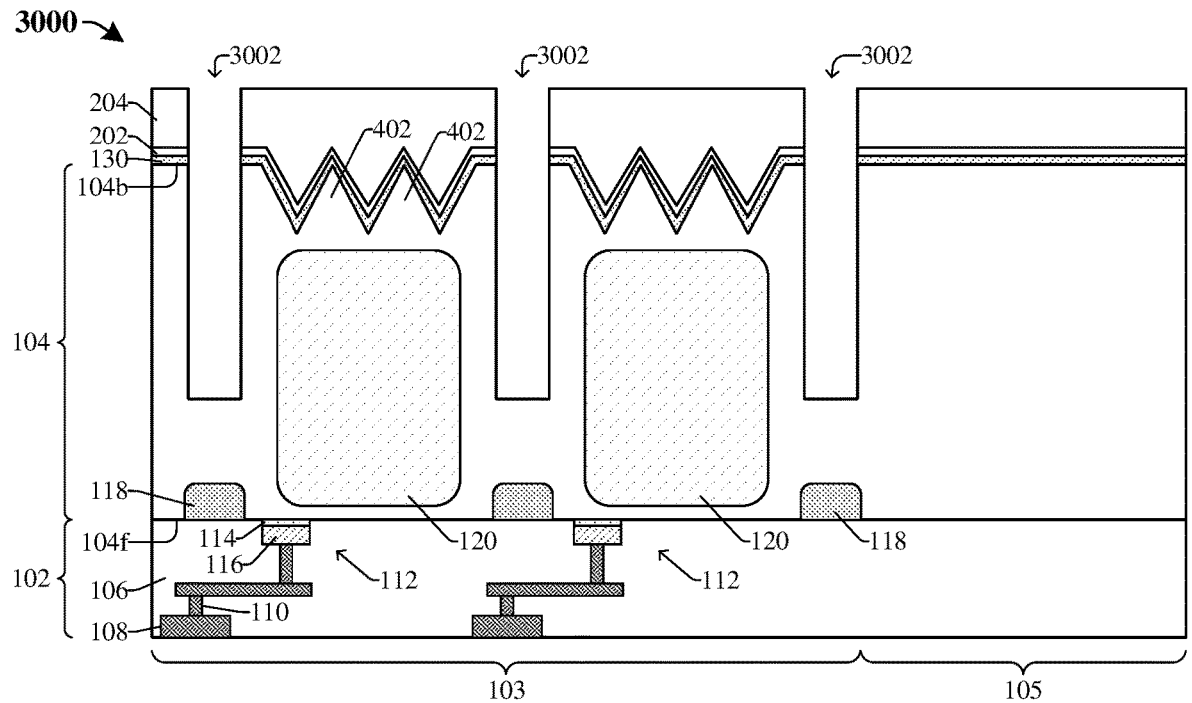

As shown in cross-sectional view 3000 of FIG. 30, a patterning process is performed on the back-side surface 104b of the semiconductor substrate 104 to form an isolation opening 3002 extending into the back-side surface 104b. In some embodiments, the patterning process includes: forming a masking layer (not shown) over the second dielectric layer 204; etching (e.g., by a dry etch process, a wet etch process, etc.) the semiconductor substrate 104 according to the masking layer; and removing the masking layer.

Figure 31:
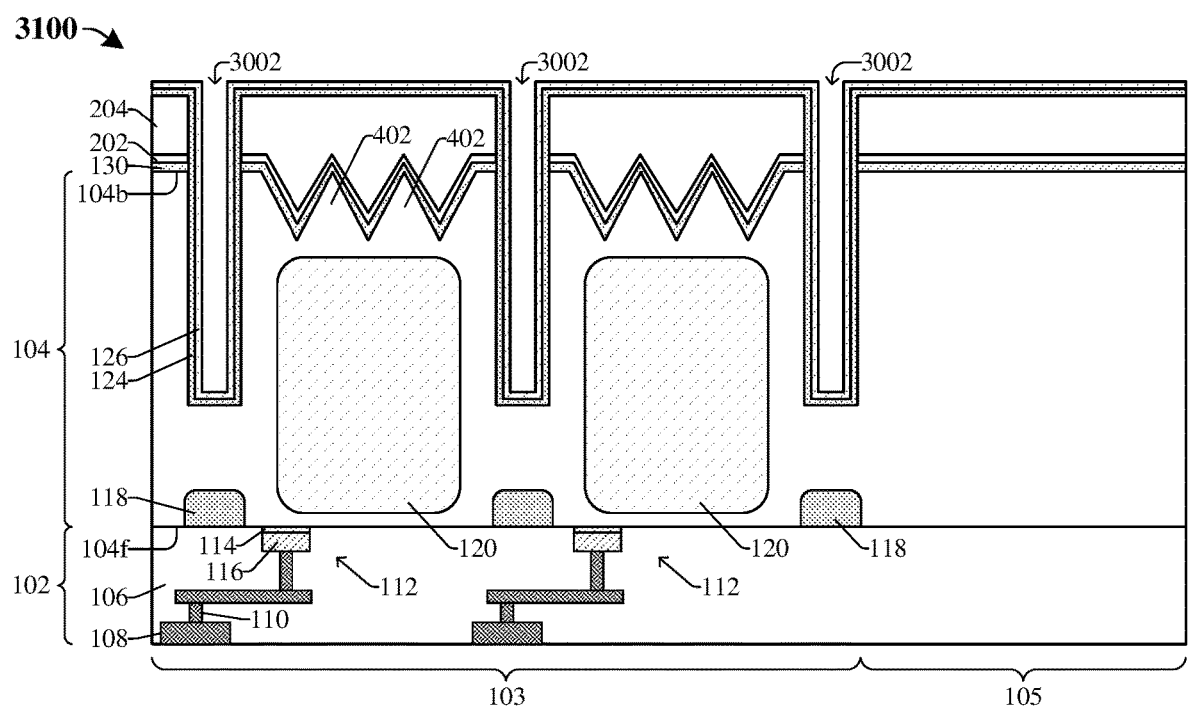

As shown in cross-sectional view 3100 of FIG. 31, a first liner layer 124 is deposited over the semiconductor substrate 104 lining the isolation opening 3002 and a second liner layer 126 is deposited over the first liner layer 124. In some embodiments, the first liner layer 124 and the second liner layer 126 are respectively deposited by a CVD process, a PVD process, an ALD process, or some other suitable growth or deposition process. The first liner layer 124 may, for example, be or comprise a high-k dielectric material such as aluminum oxide, hafnium oxide, titanium oxide, another high-k dielectric material, another dielectric material, or any combination of the foregoing. The second liner layer 126 may, for example, be or comprise silicon dioxide, another suitable dielectric material, or the like.

Figure 32:
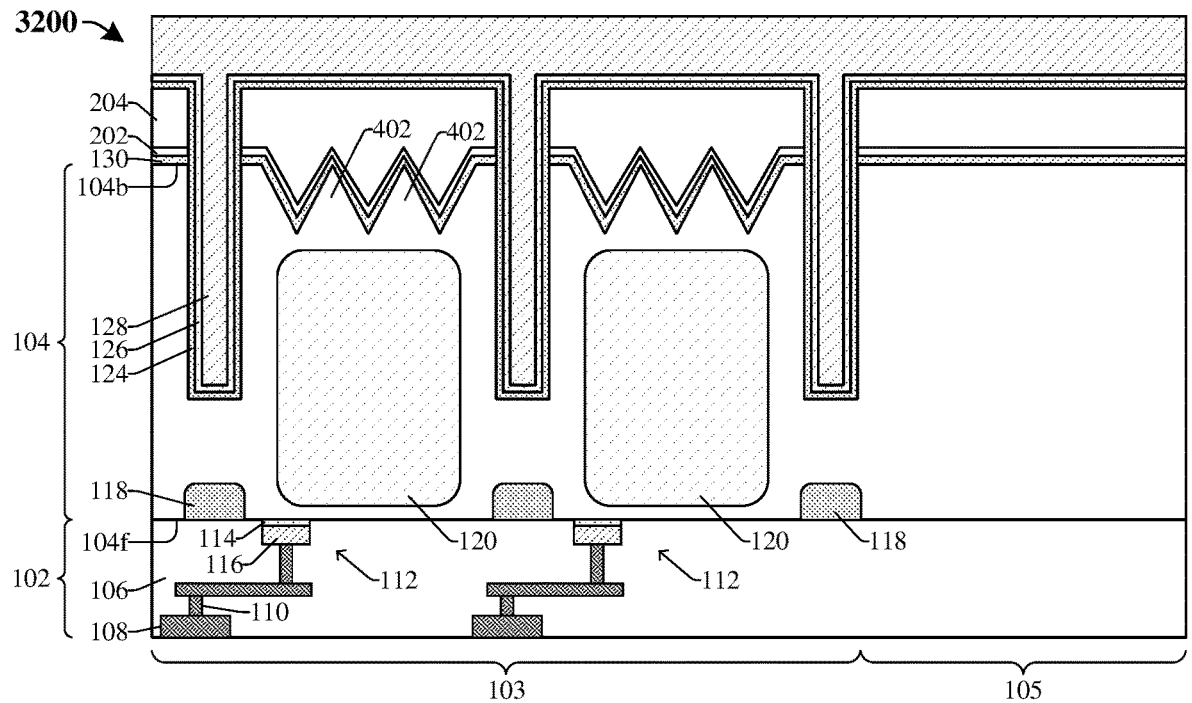

As shown in cross-sectional view 3200 of FIG. 32, a trench fill layer 128 is deposited over the second liner layer 126 and within the isolation opening (3002 of FIG. 31). In various embodiments, the trench fill layer 128 is deposited over the second liner layer 126 by a CVD process, a PVD process, an ALD process, electroplating, electroless plating, or another suitable growth or deposition process. The trench fill layer 128 may, for example, be or comprise polysilicon, doped polysilicon, a metal such as tungsten, aluminum, another metal material, or any combination of the foregoing. In some embodiments, before depositing the trench fill layer 128 a blanket etch process may be performed to remove portions of the second liner layer 126 and/or the first liner layer 124 disposed on the top surface of the second dielectric layer 204 (not shown). In various embodiments, after the blanket etch process top surfaces of the first and second liner layers 124, 126 are aligned with the top surface of the second dielectric layer 204 (e.g., as illustrated in FIG. 2).

Figure 33:
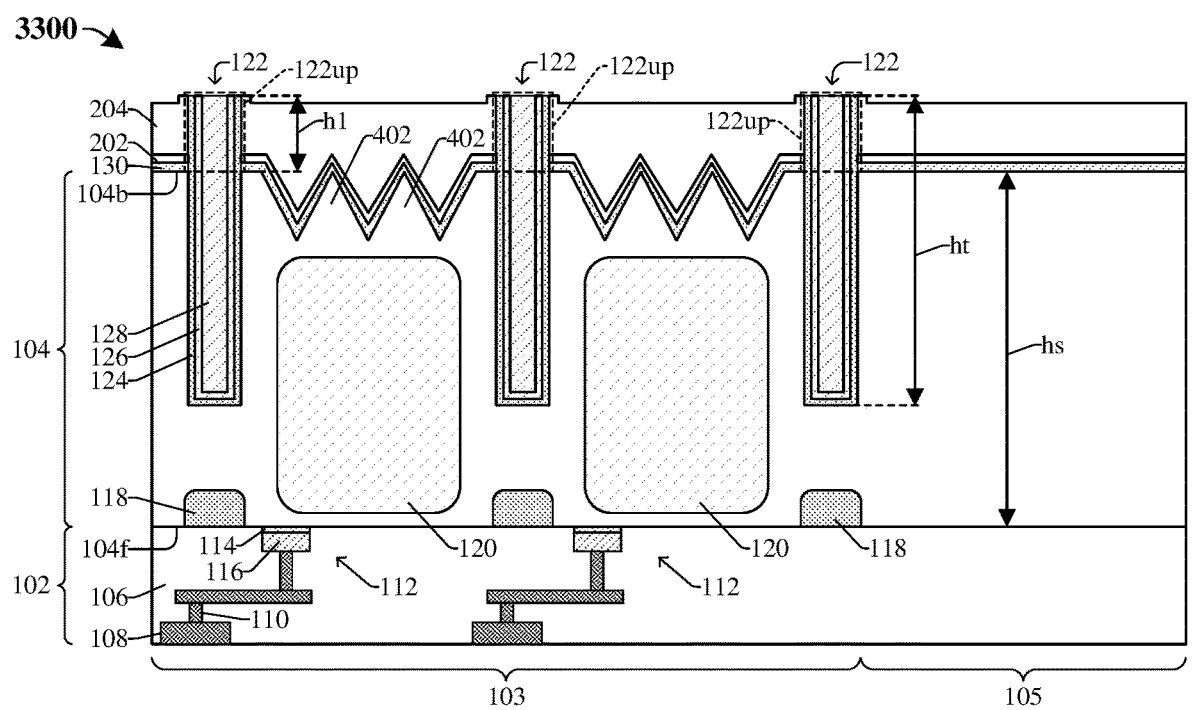

As shown in cross-sectional view 3300 of FIG. 33, a removal process is performed to remove excess materials from over the second dielectric layer 204, thereby forming an isolation structure 122 extending into the semiconductor substrate 104. In some embodiments, the removal process includes performing an etch process into the first liner layer 124, the second liner layer 126, and/or the trench fill layer 128 to remove the excess materials from over the second dielectric layer 204. In various embodiments, the etch process comprises a dry etch, a blanket etch, or the like. The etch process may over etch and remove at least a portion of the second dielectric layer 204. In yet further embodiments, the removal process includes performing a CMP process into the first liner layer 124, the second liner layer 126, and/or the trench fill layer 128 until a top surface of the second dielectric layer 204 is reached. In various embodiments, a top surface of the isolation structure 122 is co-planar with a top surface of the second dielectric layer 204. Further, the removal process is performed such that the isolation structure 122 comprises an upper portion 122up extending above the semiconductor substrate 104 and having a height h1. In various embodiments, the height h1 of the upper portion 122up of the isolation structure 122 is within a range of about 800 angstroms to about 1300 angstroms, within a range of about 800 angstroms to about 1050 angstroms, within a range of about 1050 angstroms to about 1300 angstroms, or some other suitable value. In yet further embodiments, a height ht of the isolation structure 122 is less than a height hs of the semiconductor substrate 104.

Figure 34:
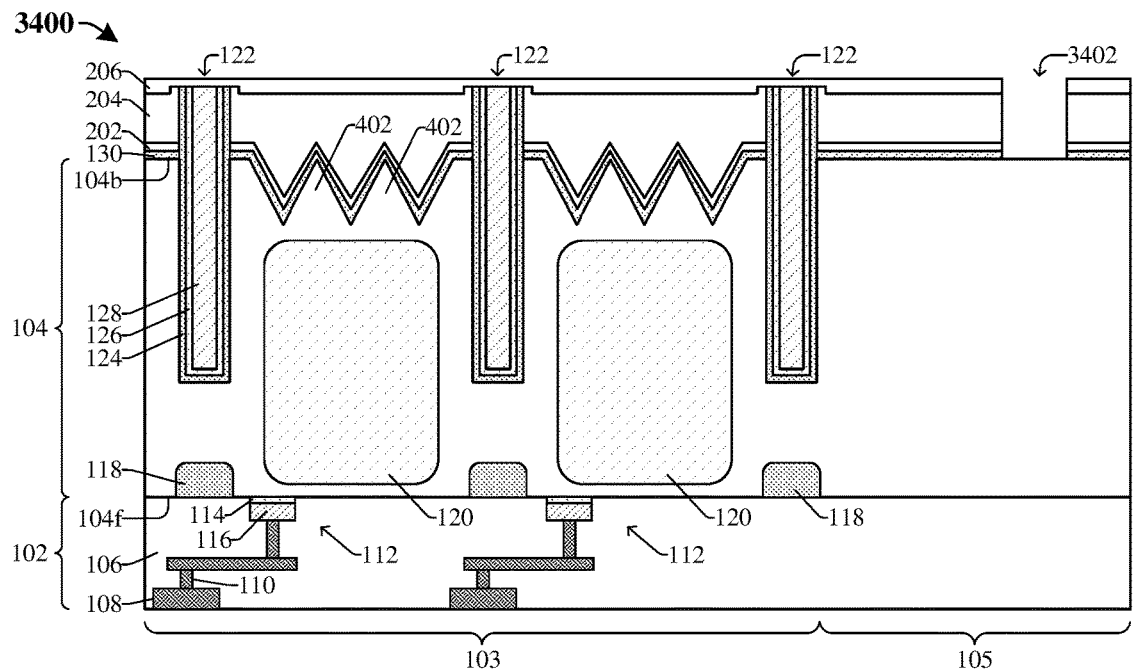

As shown in cross-sectional view 3400 of FIG. 34, a third dielectric layer 206 is deposited over the isolation structure 122 and a patterning process is performed to form an opening 3402 in a peripheral region 105 of the semiconductor substrate 104. In some embodiments, the third dielectric layer 206 is deposited by a CVD process, a PVD process, an ALD process, or some other suitable growth or deposition process. In various embodiments, the patterning process comprises: forming a masking layer (not shown) over the third dielectric layer 206; performing an etching process (e.g., a dry etch, a wet etch, etc.) according to the masking layer; and removing the masking layer. The opening 3402 exposes a portion of the back-side surface 104b of the semiconductor substrate 104 in the peripheral region 105.

Figure 35:
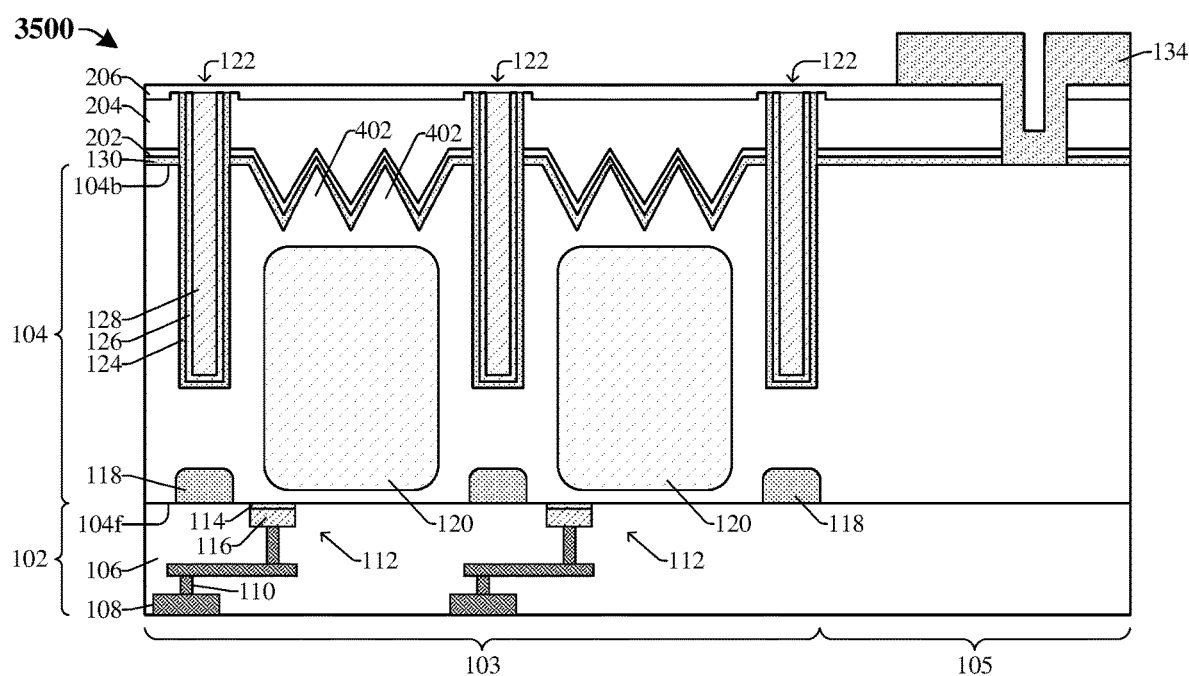

As shown in cross-sectional view 3500 of FIG. 35, a conductive pad 134 is formed within the opening (3402 of FIG. 34) and on the back-side surface 104b of the semiconductor substrate 104 in the peripheral region 105. In some embodiments, a process for forming the conductive pad 134 includes depositing (e.g., by CVD, PVD, ALD, electroplating, electroless plating, etc.) a conductive material over the semiconductor substrate 104 and within the opening (3402 of FIG. 34) and patterning the conductive material. The conductive pad 134 may, for example, be or comprise aluminum, copper, titanium, tungsten, another conductive material, or any combination of the foregoing. In various embodiments, the trench fill layer 128 comprises a first metal material and the conductive pad 134 comprises a second metal material different from the first metal material.

Figure 36:
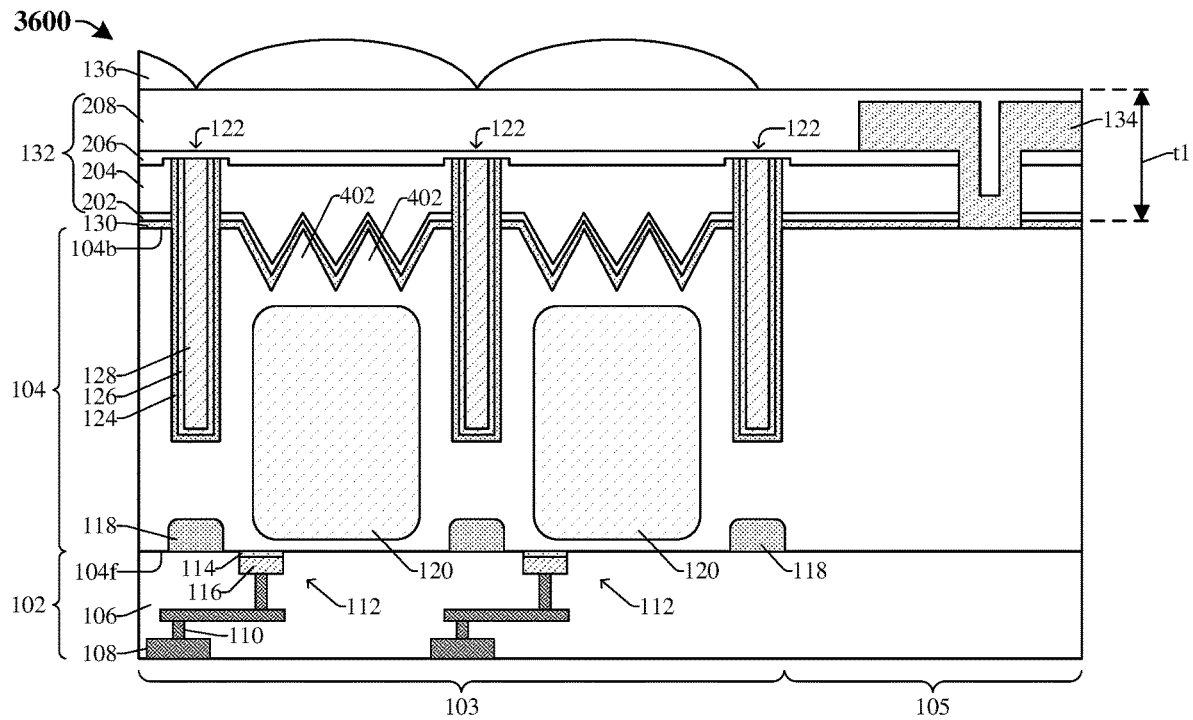

As shown in cross-sectional view 3600 of FIG. 36, a fourth dielectric layer 208 is formed over the third dielectric layer 206 and the conductive pad 134, thereby forming an upper dielectric structure 132. Further a plurality of microlenses 136 is formed on the fourth dielectric layer 208. The upper dielectric structure 132 comprises the first dielectric layer 202, the second dielectric layer 204, the third dielectric layer 206, and the fourth dielectric layer 208. In some embodiments, a planarization process (e.g., a CMP process) is performed on the fourth dielectric layer 208 such that the upper dielectric structure 132 has a thickness t1. In some embodiments, the thickness t1 is about 4700 angstroms, within a range of about 3000 angstroms to about 6000 angstroms, or some other suitable value.

FIGS. 37-45 illustrate cross-sectional views 3700-4500 of some embodiments of a method of forming an image sensor comprising an isolation structure protruding above a semiconductor substrate into an upper dielectric structure. Although the cross-sectional views 3700-4500 shown in FIGS. 37-45 are described with reference to a method, it will be appreciated that the structures shown in FIGS. 37-45 are not limited to the method but rather may stand alone separate of the method. Furthermore, although FIGS. 37-45 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 37:
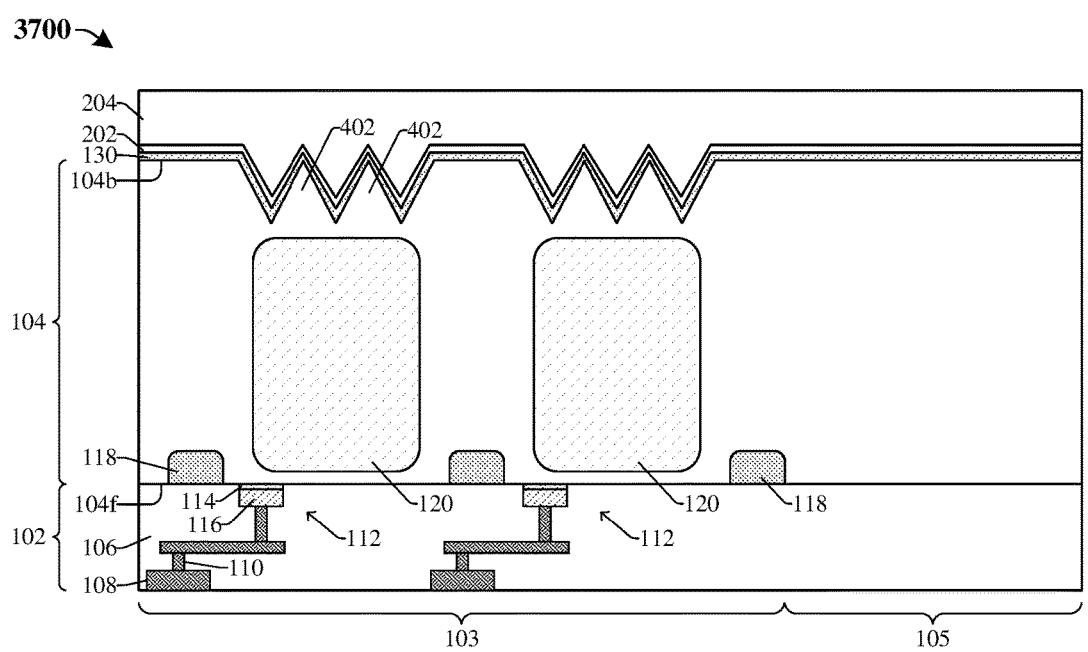
FIGS. 37-45 illustrate cross-sectional views of further embodiments of a method of forming an image sensor comprising an isolation structure protruding above a semiconductor substrate into an upper dielectric structure.

As shown in cross-sectional view 3700 of FIG. 37, a plurality of protrusions 402 is formed on a back-side surface 104b of the semiconductor substrate 104, and a passivation layer 130, a first dielectric layer 202, and a second dielectric layer 204 are formed over the plurality of protrusions 402. In some embodiments, the structure of FIG. 37 is formed as illustrated and/or described in FIGS. 26-29.

Figure 38:
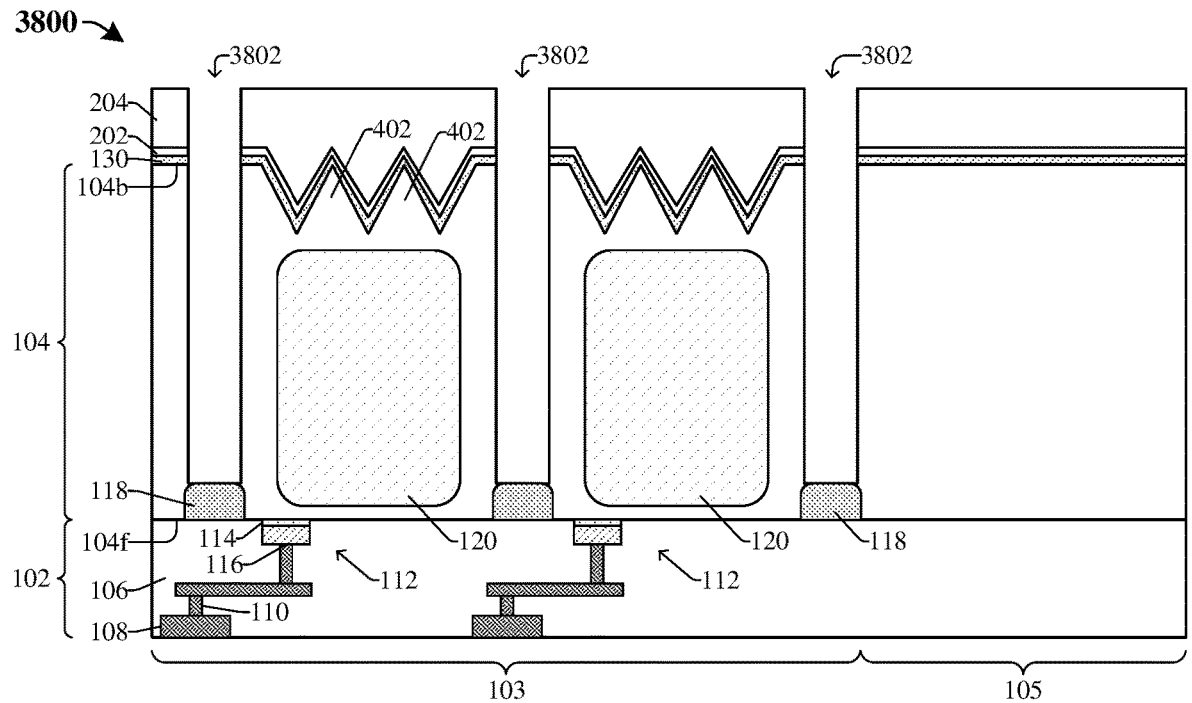

As shown in cross-sectional view 3800 of FIG. 38, a patterning process is performed on the back-side surface 104b of the semiconductor substrate 104 to form an isolation opening 3802 extending into the back-side surface 104b. In some embodiments, the patterning process includes: forming a masking layer (not shown) over the second dielectric layer 204; etching (e.g., by a dry etch process, a wet etch process, etc.) the semiconductor substrate 104 according to the masking layer; and removing the masking layer. In various embodiments, the patterning process is performed until a top surface of the STI structure 118 is reached. In yet further embodiments, the patterning process is performed such that a bottom of the isolation opening 3802 is disposed vertically above the top surface of the STI structure 118 (e.g., as illustrated in FIG. 11) (not shown).

Figure 39:
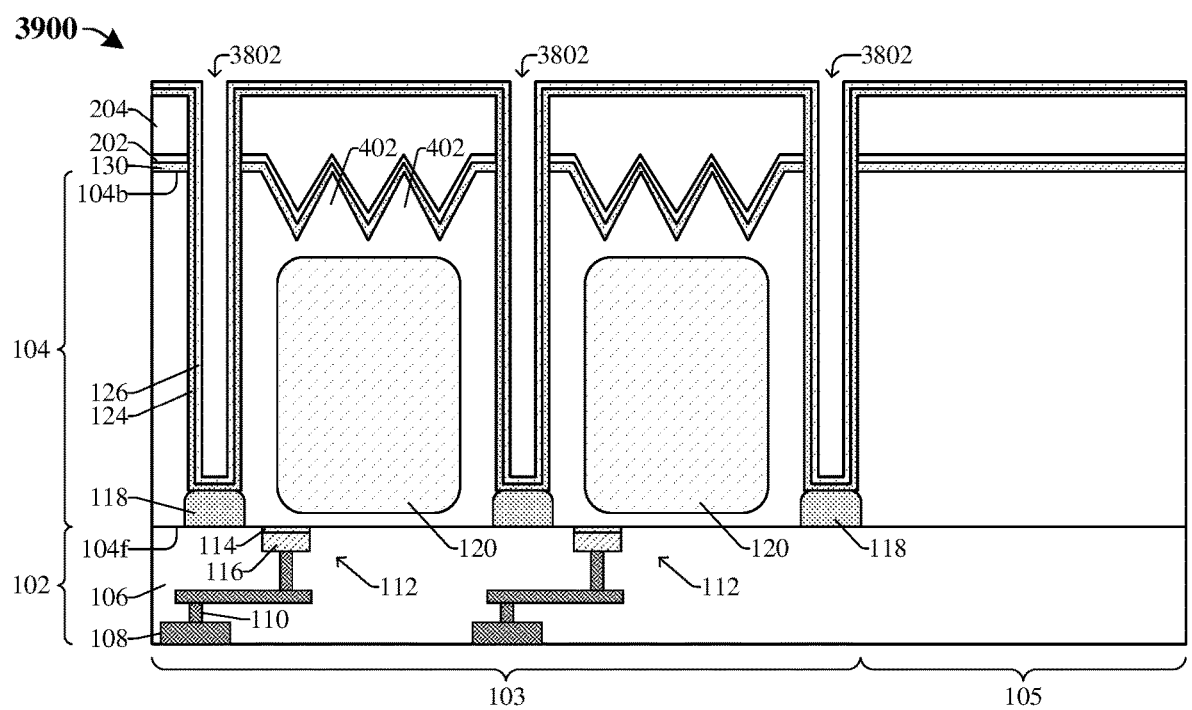

As shown in cross-sectional view 3900 of FIG. 39, a first liner layer 124 is deposited over the semiconductor substrate 104 lining the isolation opening 3802 and a second liner layer 126 is deposited over the first liner layer 124. In some embodiments, the first liner layer 124 and the second liner layer 126 are respectively deposited by a CVD process, a PVD process, an ALD process, or some other suitable growth or deposition process. The first liner layer 124 may, for example, be or comprise a high-k dielectric material such as aluminum oxide, hafnium oxide, titanium oxide, another high-k dielectric material, another dielectric material, or any combination of the foregoing. The second liner layer 126 may, for example, be or comprise silicon dioxide, another suitable dielectric material, or the like.

Figure 40:
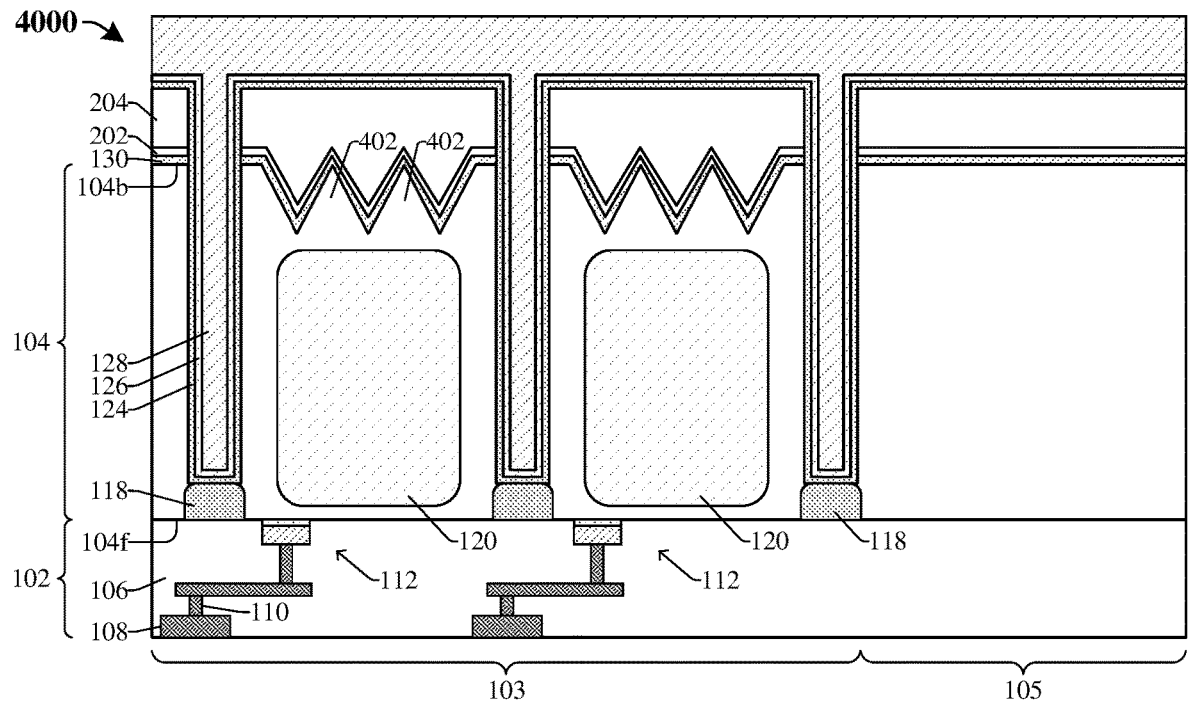

As shown in cross-sectional view 4000 of FIG. 40, a trench fill layer 128 is deposited over the second liner layer 126 and within the isolation opening (3802 of FIG. 39). In various embodiments, the trench fill layer 128 is deposited over the second liner layer 126 by a CVD process, a PVD process, an ALD process, electroplating, electroless plating, or another suitable growth or deposition process. The trench fill layer 128 may, for example, be or comprise polysilicon, doped polysilicon, a metal such as tungsten, aluminum, another metal material, or any combination of the foregoing. In some embodiments, before depositing the trench fill layer 128 a blanket etch process may be performed to remove portions of the second liner layer 126 and/or the first liner layer 124 disposed on the top surface of the second dielectric layer 204 (not shown). In various embodiments, after the blanket etch process top surfaces of the first and second liner layers 124, 126 are aligned with the top surface of the second dielectric layer 204 (e.g., as illustrated in FIG. 2).

Figure 41:
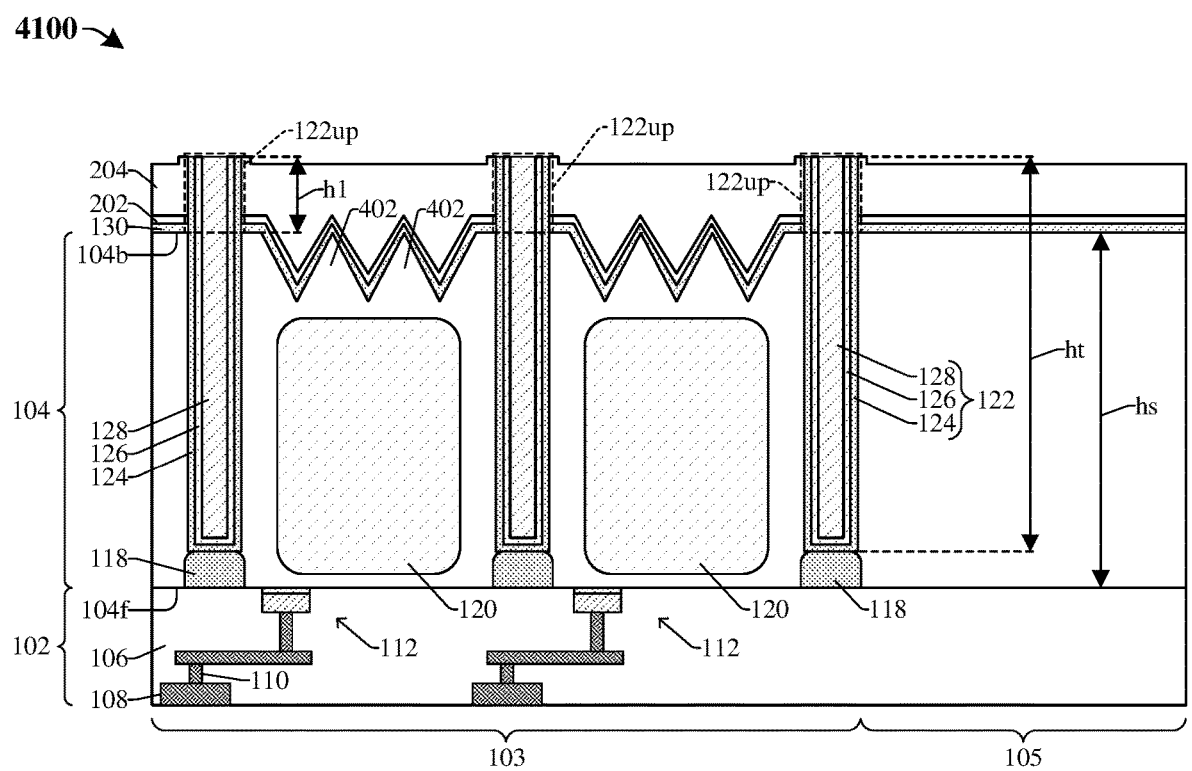

As shown in cross-sectional view 4100 of FIG. 41, a removal process is performed to remove excess materials from over the second dielectric layer 204, thereby forming an isolation structure 122 extending into the semiconductor substrate 104. In some embodiments, the removal process includes performing an etch process into the first liner layer 124, the second liner layer 126, and/or the trench fill layer 128 to remove the excess materials from over the second dielectric layer 204. In various embodiments, the etch process comprises a dry etch, a blanket etch, or the like. The etch process may over etch and remove at least a portion of the second dielectric layer 204. In yet further embodiments, the removal process includes performing a CMP process into the first liner layer 124, the second liner layer 126, and/or the trench fill layer 128 until a top surface of the second dielectric layer 204 is reached. In various embodiments, a top surface of the isolation structure 122 is co-planar with a top surface of the second dielectric layer 204. Further, the removal process is performed such that the isolation structure 122 comprises an upper portion 122up extending above the semiconductor substrate 104 and having a height h1. In various embodiments, the height h1 of the upper portion 122up of the isolation structure 122 is within a range of about 800 angstroms to about 1300 angstroms, within a range of about 800 angstroms to about 1050 angstroms, within a range of about 1050 angstroms to about 1300 angstroms, or some other suitable value. In some embodiments, a height ht of the isolation structure 122 is greater than a height hs of the semiconductor substrate 104. In yet further embodiments, the isolation structure 122 is formed such that the height ht of the isolation structure 122 is less than the height hs of the semiconductor substrate 104 (e.g., as illustrated in FIG. 5D).

Figure 42:
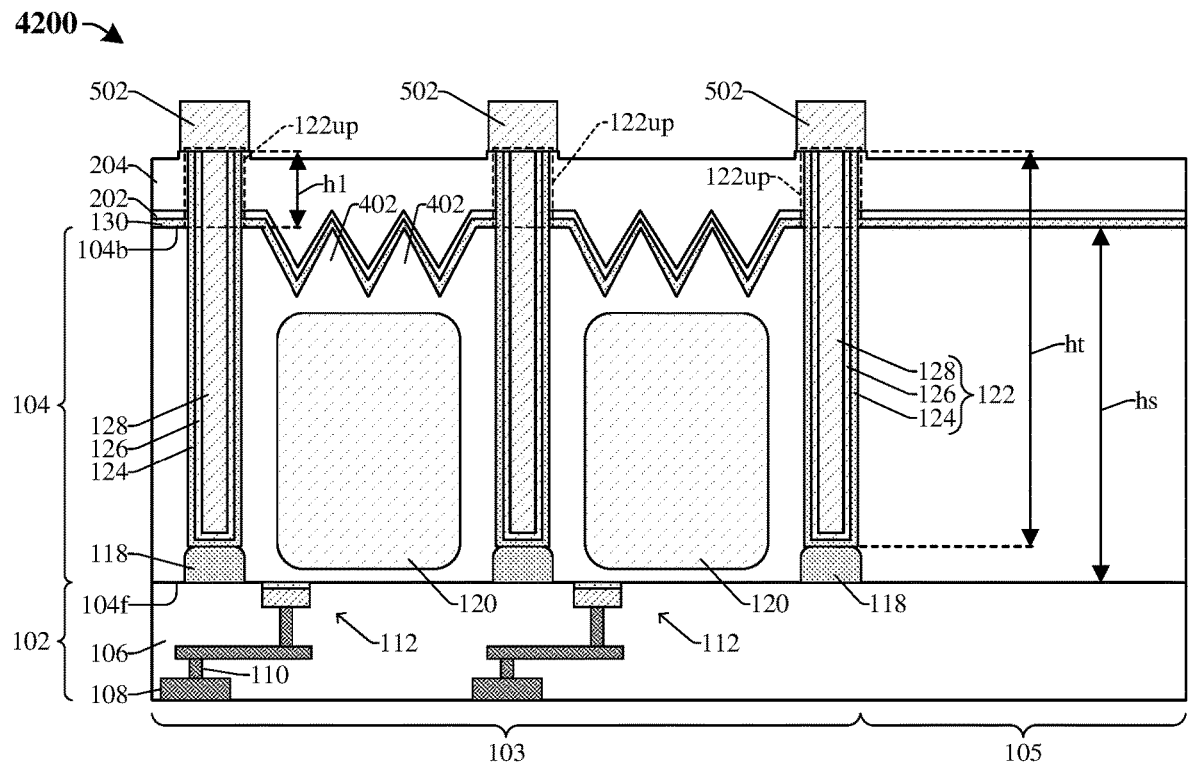

As shown in cross-sectional view 4200 of FIG. 42, a metal grid structure 502 is formed on the isolation structure 122. In some embodiments, a process for forming the metal grid structure 502 comprises: depositing (e.g., by a CVD process, a PVD process, an ALD process, electroplating, electroless plating, etc.) a metal material over the back-side surface 104b of the semiconductor substrate 104; and patterning the metal material. In further embodiments, the metal grid structure 502 is formed concurrently with the isolation structure 122, where the metal grid structure 502 is defined from the removal process of FIG. 41 and the metal grid structure 502 and the trench fill layer 128 are a single continuous structure (e.g., as illustrated and/or described in FIG. 5C). In yet further embodiments, the patterning process is performed such that a center of the metal grid structure 502 is shifted from a center of the isolation structure 122 in a direction towards the peripheral region 105 of the semiconductor substrate 104 (e.g., as illustrated and/or described in FIG. 5B). In various embodiments, the metal grid structure 502 comprises a same metal material as the trench fill layer 128.

Figure 43:
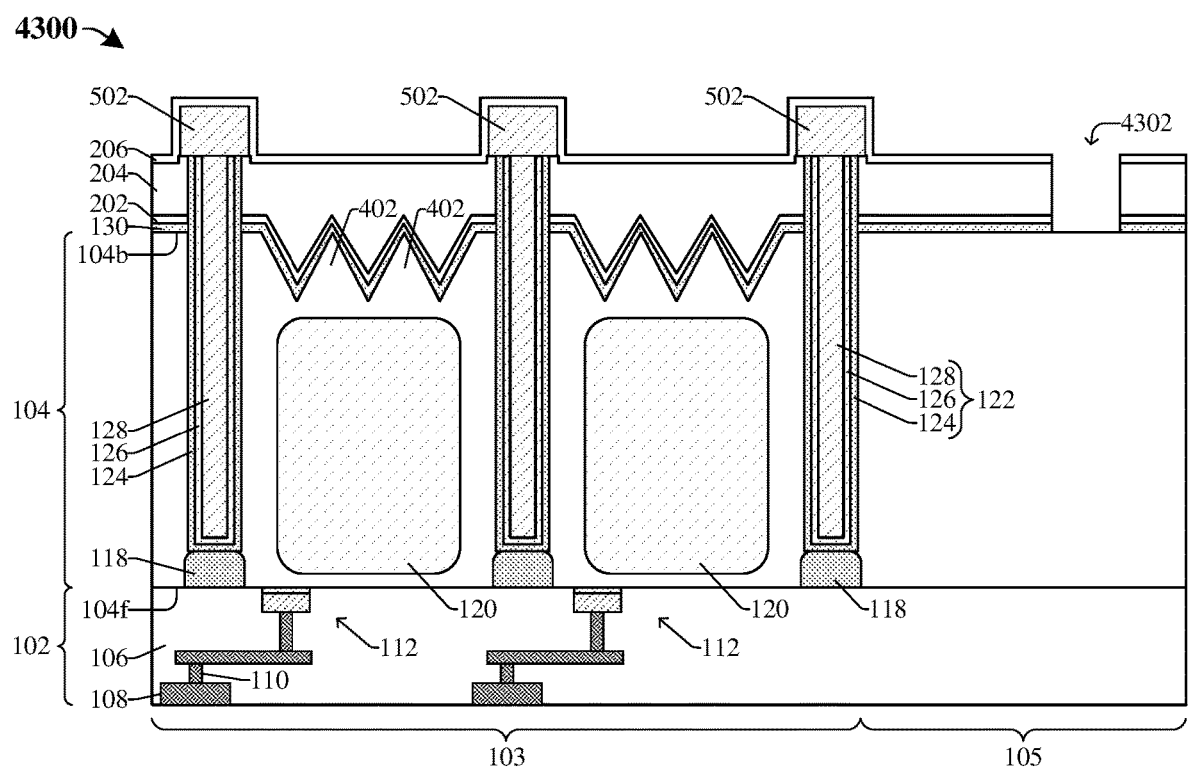

As shown in cross-sectional view 4300 of FIG. 43, a third dielectric layer 206 is deposited over the metal grid structure 502 and a patterning process is performed to form an opening 4302 in a peripheral region 105 of the semiconductor substrate 104. In some embodiments, the third dielectric layer 206 is deposited by a CVD process, a PVD process, an ALD process, or some other suitable growth or deposition process. In various embodiments, the patterning process comprises: forming a masking layer (not shown) over the third dielectric layer 206; performing an etching process (e.g., a dry etch, a wet etch, etc.) according to the masking layer; and removing the masking layer. The opening 4302 exposes a portion of the back-side surface 104b of the semiconductor substrate 104 in the peripheral region 105.

Figure 44:
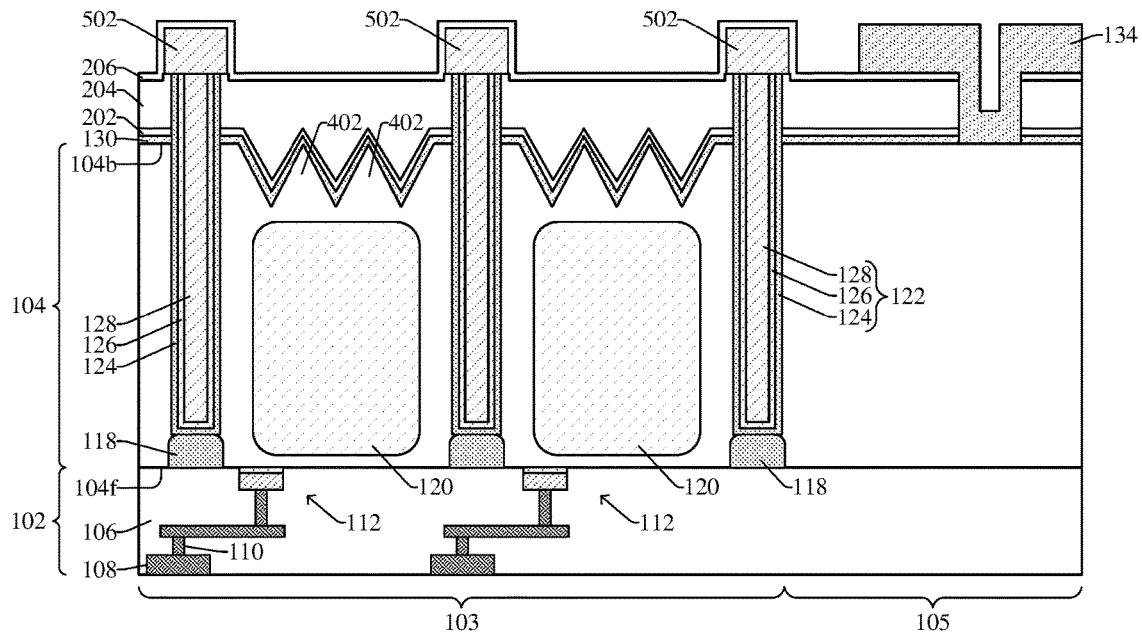

As shown in cross-sectional view 4400 of FIG. 44, a conductive pad 134 is formed within the opening (4302 of FIG. 43) and on the back-side surface 104b of the semiconductor substrate 104 in the peripheral region 105. In some embodiments, a process for forming the conductive pad 134 includes depositing (e.g., by CVD, PVD, ALD, electroplating, electroless plating, etc.) a conductive material over the semiconductor substrate 104 and within the opening (4302 of FIG. 43) and patterning the conductive material. The conductive pad 134 may, for example, be or comprise aluminum, copper, titanium, tungsten, another conductive material, or any combination of the foregoing. In various embodiments, the trench fill layer 128 and/or the metal grid structure 502 comprise(s) a first metal material and the conductive pad 134 comprises a second metal material different from the first metal material.

Figure 45:
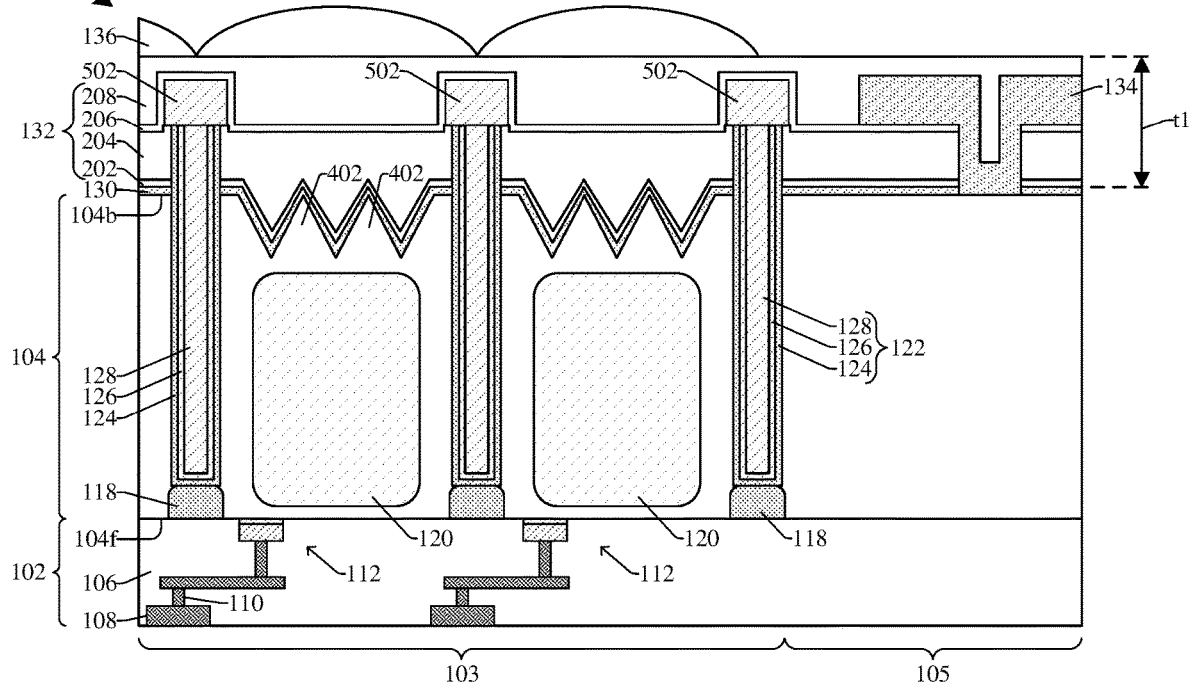

As shown in cross-sectional view 4500 of FIG. 45, a fourth dielectric layer 208 is formed over the third dielectric layer 206 and the conductive pad 134, thereby forming an upper dielectric structure 132. Further a plurality of microlenses 136 is formed on the fourth dielectric layer 208. The upper dielectric structure 132 comprises the first dielectric layer 202, the second dielectric layer 204, the third dielectric layer 206, and the fourth dielectric layer 208. In some embodiments, a planarization process (e.g., a CMP process) is performed on the fourth dielectric layer 208 such that the upper dielectric structure 132 has a thickness t1. In some embodiments, the thickness t1 is about 4700 angstroms, within a range of about 3000 angstroms to about 6000 angstroms, or some other suitable value.

Figure 46:
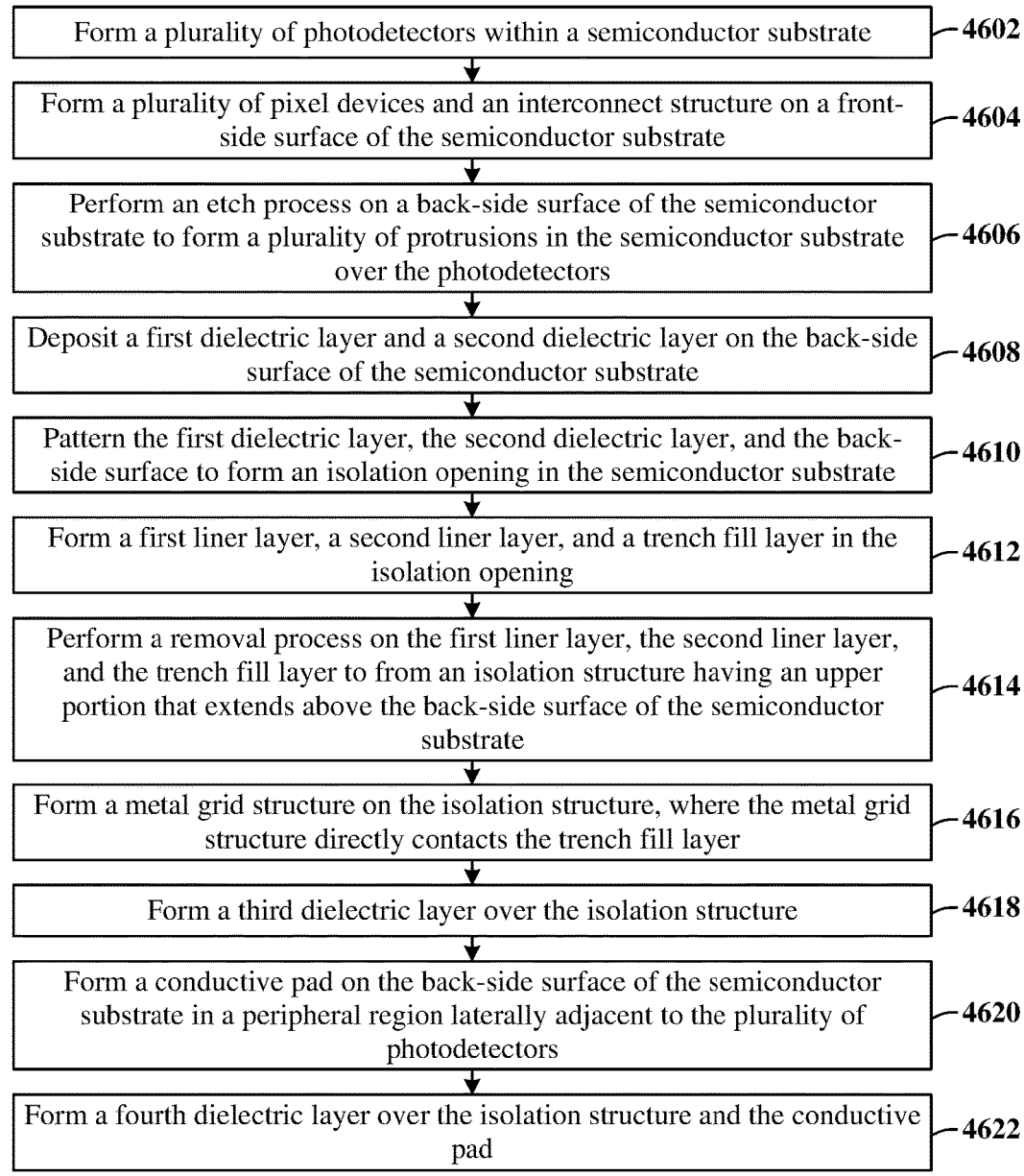
FIG. 46 illustrates a flowchart according to some embodiments of a method of forming an image sensor comprising an isolation structure protruding above a semiconductor substrate into an upper dielectric structure.

FIG. 46 illustrates a method 4600 of forming an image sensor comprising an isolation structure protruding above a semiconductor substrate into an upper dielectric structure. Although the method 4600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 4602, a plurality of photodetectors is formed within a semiconductor substrate. FIG. 6 illustrates a cross-sectional view 600 corresponding to some embodiments of act 4602.

At act 4604, a plurality of pixel devices and an interconnect structure are formed on a front-side surface of the semiconductor substrate. FIG. 8 illustrates a cross-sectional view 800 corresponding to some embodiments of act 4604.

At act 4606, an etch process is performed on a back-side surface of the semiconductor substrate to form a plurality of protrusions in the semiconductor substrate over the photodetectors. FIG. 27 illustrates a cross-sectional view 2700 corresponding to some embodiments of act 4606.

At act 4608, a first dielectric layer and a second dielectric layer are deposited on the back-side surface of the semiconductor substrate. FIGS. 9 and 10 illustrate cross-sectional views 900 and 1000 corresponding to various embodiments of act 4608. FIGS. 28 and 29 illustrate cross-sectional views 2800 and 2900 corresponding to some embodiments of act 4608.

At act 4610, the first dielectric layer, the second dielectric layer, and the back-side surface are patterned to form an isolation opening in the semiconductor substrate. FIG. 11 illustrates a cross-sectional view 1100 corresponding to various embodiments of act 4610. FIG. 19 illustrates a cross-sectional view 1900 corresponding to some embodiments of act 4610. FIG. 30 illustrates a cross-sectional view 3000 corresponding to other embodiments of act 4610. FIG.

38 illustrates a cross-sectional view 3800 corresponding to further embodiments of act 4610.

At act 4612, a first liner layer, a second liner layer, and a trench fill layer are formed in the isolation opening. FIGS. 12 and 13 illustrate cross-sectional views 1200 and 1300 corresponding to various embodiments of act 4612. FIGS. 20 and 21 illustrate cross-sectional views 2000 and 2100 corresponding to some embodiments of act 4612. FIGS. 31 and 32 illustrate cross-sectional views 3100 and 3200 corresponding to other embodiments of act 4612. FIGS. 39 and 40 illustrate cross-sectional views 3900 and 4000 corresponding to further embodiments of act 4612.

At act 4614, a removal process is performed on the first liner layer, the second liner layer, and the trench fill layer to form an isolation structure having an upper portion that extends above the back-side surface of the semiconductor substrate. FIG. 14 illustrates a cross-sectional view 1400 corresponding to various embodiments of act 4614. FIG. 22 illustrates a cross-sectional view 2200 corresponding to some embodiments of act 4614. FIG. 33 illustrates a cross-sectional view 3300 corresponding to other embodiments of act 4614. FIG. 41 illustrates a cross-sectional view 4100 corresponding to further embodiments of act 4614.

At act 4616, a metal grid structure is formed on the isolation structure, where the metal grid structure directly contacts the trench fill layer. FIG. 42 illustrates a cross-sectional view 4200 corresponding to various embodiments of act 4616.

At act 4618, a third dielectric layer is formed over the isolation structure. FIG. 15 illustrates a cross-sectional view 1500 corresponding to various embodiments of act 4618. FIG. 23 illustrates a cross-sectional view 2300 corresponding to some embodiments of act 4618. FIG. 34 illustrates a cross-sectional view 3400 corresponding to other embodiments of act 4618. FIG. 43 illustrates a cross-sectional view 4300 corresponding to further embodiments of act 4618.

At act 4620, a conductive pad is formed on the back-side surface of the semiconductor substrate in a peripheral region laterally adjacent to the plurality of photodetectors. FIG. 16 illustrates a cross-sectional view 1600 corresponding to various embodiments of act 4620. FIG. 24 illustrates a cross-sectional view 2400 corresponding to some embodiments of act 4620. FIG. 35 illustrates a cross-sectional view 3500 corresponding to other embodiments of act 4620. FIG. 44 illustrates a cross-sectional view 4400 corresponding to further embodiments of act 4620.

At act 4622, a fourth dielectric layer is formed over the isolation structure and the conductive pad. FIG. 17 illustrates a cross-sectional view 1700 corresponding to various embodiments of act 4622. FIG. 25 illustrates a cross-sectional view 2500 corresponding to some embodiments of act 4622. FIG. 36 illustrates a cross-sectional view 3600 corresponding to other embodiments of act 4622. FIG. 45 illustrates a cross-sectional view 4500 corresponding to further embodiments of act 4622.

Accordingly, in some embodiments, the present disclosure relates to an image sensor comprising a plurality of photodetectors disposed in a semiconductor substrate and an isolation structure disposed in the semiconductor substrate and having an upper portion protruding above a back-side surface of the semiconductor substrate.

In some embodiments, the present application provides an image sensor, including: a photodetector disposed within a semiconductor substrate; a dielectric structure disposed on a first side of the semiconductor substrate; and an isolation structure extending from the dielectric structure into the first side of the semiconductor substrate, wherein the isolation structure laterally wraps around the photodetector and comprises an upper portion disposed above the first side of the semiconductor substrate and directly contacting sidewalls of the dielectric structure, and wherein the isolation structure comprises a first material different from a second material of the dielectric structure. In an embodiment, the isolation structure comprises a trench fill layer and a first liner layer disposed between the semiconductor substrate and the trench fill layer, wherein the trench fill layer comprises the first material and the first liner layer comprises a third material different from the first material, wherein the first material comprises a metal. In an embodiment, the third material is different from the second material. In an embodiment, the isolation structure further comprises a second liner layer disposed between the trench fill layer and the first liner layer, wherein the second liner layer comprises the second material. In an embodiment, the image sensor further comprises a metal grid structure overlying the isolation structure and directly contacting a top surface of the isolation structure. In an embodiment, a height of the upper portion of the isolation structure is greater than a height of the metal grid structure. In an embodiment, a height of the isolation structure is greater than a height of the semiconductor substrate. In an embodiment, the image sensor further comprises a passivation layer disposed between the dielectric structure and the first side of the semiconductor substrate, wherein a top surface of the isolation structure is vertically above a top surface of the passivation layer. In an embodiment, the image sensor further comprises a metal reflector disposed within the dielectric structure over the first side of the semiconductor substrate, wherein a top surface of the isolation structure is disposed between an upper surface and a lower surface of the metal reflector.

In some embodiments, the present application provides an image sensor including: a photodetector disposed within a semiconductor substrate, wherein the semiconductor substrate comprises a first side opposite a second side; an interconnect structure disposed on the first side of the semiconductor substrate; a dielectric structure disposed on the second side of the semiconductor substrate; a metal grid structure disposed within the dielectric structure, wherein the metal grid structure is vertically offset from the second side of the semiconductor substrate by a first distance, wherein the photodetector is spaced between opposing sidewalls of the metal grid structure; and an isolation structure disposed in the semiconductor substrate, wherein the isolation structure comprises an upper portion that continuously extends along the first distance from the second side of the semiconductor substrate to a bottom surface of the metal grid structure. In an embodiment, a height of the upper portion of the isolation structure is within a range of about 800 angstroms to about 1300 angstroms. In an embodiment, the isolation structure comprises a trench fill layer, wherein the trench fill layer and the metal grid structure comprise a first metal material. In an embodiment, the isolation structure further comprises a first liner layer disposed between the trench fill layer and the semiconductor substrate and a second liner layer disposed between the first liner layer and the trench fill layer, wherein a top surface of the first liner layer and a top surface of the second liner layer directly contact the bottom surface of the metal grid structure. In an embodiment, the image sensor further comprises a conductive pad disposed on the second side of the semiconductor substrate, wherein a top surface of the isolation structure is disposed between a top surface and a lower surface of the conductive pad, and wherein the conductive pad comprises a second metal material different from the first metal material. In an embodiment, no dielectric material exists between a top surface of the trench fill layer and the bottom surface of the metal grid structure. In an embodiment, the image sensor further comprises a shallow trench isolation (STI) structure disposed in the first side of the semiconductor substrate, wherein a top surface of the STI structure directly contacts a bottom surface of the isolation structure.

In some embodiments, the present application provides a method for forming an image sensor, the method includes: forming a photodetector in a semiconductor substrate, wherein the semiconductor substrate comprises a front-side surface opposite a back-side surface; forming an interconnect structure on the front-side surface of the semiconductor substrate; depositing a first dielectric layer and a second dielectric layer on the back-side surface of the semiconductor substrate; and forming an isolation structure extending into the back-side surface of the semiconductor substrate, wherein the isolation structure comprises an upper portion disposed vertically above the back-side surface and contacting sidewalls of the second dielectric layer, wherein the isolation structure comprises a first material different from a second material of the second dielectric layer. In an embodiment, the method further comprises forming a metal grid structure over the back-side surface of the semiconductor substrate, wherein the metal grid structure directly contacts a top surface of the isolation structure, and wherein the metal grid structure comprises the first material. In an embodiment, the method further comprises patterning the back-side surface of the semiconductor substrate to form a plurality of protrusions over the photodetector before depositing the first dielectric layer. In an embodiment, a height of the plurality of protrusions is less than a height of the upper portion of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a photodetector in a semiconductor substrate, wherein the semiconductor substrate comprises a front-side surface opposite a back-side surface;
    forming a shallow trench isolation (STI) structure extending into the front-side surface of the semiconductor substrate and having a first height;
    forming an interconnect structure on the front-side surface of the semiconductor substrate;
    depositing a first dielectric layer and a second dielectric layer on the back-side surface of the semiconductor substrate; and
    forming an isolation structure extending into the back-side surface of the semiconductor substrate, wherein the isolation structure comprises an upper portion disposed vertically above the back-side surface and contacting sidewalls of the second dielectric layer, wherein the isolation structure comprises a first material different from a second material of the second dielectric layer, wherein a second height of the upper portion is greater than the first height.

2. The method of claim 1, further comprising:
    forming a metal grid structure over the back-side surface of the semiconductor substrate, wherein the metal grid structure directly contacts a top surface of the isolation structure, and wherein the metal grid structure comprises the first material.

3. The method of claim 1, further comprising:
    patterning the back-side surface of the semiconductor substrate to form a plurality of protrusions over the photodetector before depositing the first dielectric layer.

4. The method of claim 3, wherein a height of the plurality of protrusions is less than the second height.

5. The method of claim 2, wherein forming the isolation structure comprises:
    patterning the first dielectric layer, the second dielectric layer, and the semiconductor substrate to form one or more openings in the substrate;
    depositing a first liner layer lining the one or more openings, wherein the first liner layer comprises a third material different from the first material;
    depositing a trench fill layer over the first liner layer and in the one or more openings, wherein the trench fill layer comprises the first material; and
    performing a removal process to remove portions of the first liner layer and the trench fill layer from over an upper surface of the second dielectric layer.

6. The method of claim 5, further comprising:
    depositing a second liner layer between the first liner layer and the trench fill layer, wherein a material of the second liner layer is different from the first material and the third material.

7. The method of claim 1, wherein a bottom surface of the isolation structure is vertically above the front-side surface of the semiconductor substrate, and wherein a height of the isolation structure is greater than a height of the semiconductor substrate.

8. A method for forming an image sensor, the method comprising:
    forming a first photodetector and a second photodetector in a substrate;
    forming a dielectric structure on a first surface of the substrate;
    etching the dielectric structure and the substrate to form one or more openings in the substrate;
    forming a first isolation structure in the one or more openings, wherein the first isolation structure comprises a first segment laterally between the first photodetector and the second photodetector and an upper portion elevated above the first surface of the substrate, wherein a height of the upper portion is greater than a width of the first segment; and
    forming a grid structure over the first isolation structure, wherein a height of the grid structure is less than the height of the upper portion.

9. The method of claim 8, wherein the grid structure comprises a grid segment contacting the first segment, wherein a width of the grid segment is greater than the width of the first segment.

10. The method of claim 8, further comprising:
    forming a conductive shielding structure in the dielectric structure after forming the grid structure, wherein the conductive shielding structure is laterally offset from the first isolation structure in a direction away from the first and second photodetectors.

11. The method of claim 10, wherein the conductive shielding structure comprises a first segment over an upper surface of the dielectric structure and a second segment on the first surface of the substrate.

12. The method of claim 8, wherein the first isolation structure comprises a fill layer, a first liner layer between the substrate and the fill layer, and a second liner layer between the first liner layer and the fill layer, wherein the fill layer comprises a first material, the first liner layer comprises a second material, and the second liner layer comprises a third material, wherein the first material is different from the second material and the third material, and wherein a dielectric constant of the second material is greater than that of the third material.

13. The method of claim 8, wherein forming the first isolation structure comprises:
 depositing two or more isolation layers in the one or more openings; and
 performing a removal process on the two or more isolation layers, wherein after the removal process the dielectric structure comprises an upper surface vertically offset from a top surface of the first isolation structure in a direction towards the substrate.

14. The method of claim 8, further comprising:
 forming a second isolation structure in the substrate, wherein the second isolation structure extends from a second surface of the substrate to a bottom surface of the first isolation structure, wherein a height of the second isolation structure is less than the height of the upper portion.

15. The method of claim 14, wherein the first isolation structure comprises a material different from that of the second isolation structure.

16. A method for forming an image sensor, the method comprising:
 forming a plurality of photodetectors in a pixel region of a substrate;
 depositing a passivation layer on a first surface of the substrate over the plurality of photodetectors;
 depositing a dielectric structure on the passivation layer;
 forming an isolation structure in the dielectric structure and the substrate, wherein the isolation structure is arranged laterally between adjacent photodetectors in the plurality of photodetectors, wherein the isolation structure comprises an upper vertical segment vertically above the first surface of the substrate; and
 forming a shielding structure on the first surface of the substrate and in a peripheral region of the substrate adjacent to the pixel region, wherein the shielding structure comprises a lower surface over the dielectric structure, wherein a vertical distance between the lower surface of the shielding structure and a top surface of the upper vertical segment is less than a height of the upper vertical segment.

17. The method of claim 16, wherein the height of the shielding structure is greater than the height of the upper vertical segment.

18. The method of claim 16, further comprising:
 forming a grid structure over the isolation structure and within the pixel region, wherein a top surface of the grid structure is vertically offset from a top surface of the shielding structure, and wherein a material of the grid structure is different from a material of the shielding structure.

19. The method of claim 1, wherein the STI structure contacts the isolation structure.

20. The method of claim 1, wherein the STI structure is vertically separated from the isolation structure by a distance that is greater than the first height.

* * * * *